US007057173B2

United States Patent
Wright

(10) Patent No.: US 7,057,173 B2
(45) Date of Patent: *Jun. 6, 2006

(54) MAGNETORESISTIVE (MR) SENSOR TEMPERATURE COMPENSATION AND MAGNETIC CROSS-TERM REDUCTION TECHNIQUES UTILIZING SELECTIVE SET AND RESET GAIN MEASUREMENTS

(75) Inventor: Layne L. Wright, Denver, CO (US)

(73) Assignees: Laser Technology, Inc., Centennial, CO (US); Kama-Tech (HK) Limited, Tsim Sha Tsui (HK)

( * ) Notice: Subject to any disclaimer, the term of this patent is extended or adjusted under 35 U.S.C. 154(b) by 255 days.

This patent is subject to a terminal disclaimer.

(21) Appl. No.: 10/751,806

(22) Filed: Jan. 5, 2004

(65) Prior Publication Data

US 2005/0145795 A1 Jul. 7, 2005

(51) Int. Cl.
*H01L 37/00* (2006.01)
*G01P 3/44* (2006.01)

(52) U.S. Cl. ............................. 250/338.2; 73/504.04
(58) Field of Classification Search ............ 250/338.2, 250/338.1; 73/504.04; 600/585, 500
See application file for complete search history.

(56) References Cited

U.S. PATENT DOCUMENTS

2005/0150295 A1 * 7/2005 Wright .................... 73/504.04

OTHER PUBLICATIONS

Kwiatkowski, Waldemar and Tumänski, Slawomir, The permalloy magnetoresistive sensors-properties and applications, Warsaw Technical University, ul, Koszykowa 75, PL 00-661, The Institute of Physics, J. Phys. E: Sci. Instrum, 19, 1986, pp. 502-515.

Thin Film Magnetoresistive Senors, Institute of Physics Publishing © IOP Publishing Ltd 2001, pp. iil-163, 325-336, 417-440.

Ciureaunu, Petru, "Magnetoresistive Sensors", © IOP Publishing Ltd 1992; ppvl, 253-265, 291-379, 430-436.

Hoffman, G.R., Hill, E.W. and Birtwistle, J.K., "Compensating Temperature-Induced Sensitivity Changes In Thin Film NiFeCo Magnetoresistive Magnetometers" Electricall Engineering Laboratories, University of Manchester, IEEE, vol. Mag-22, No. 5; Sep. 1986, pp. 949-951.

(Continued)

Primary Examiner—Otilia Gabor
(74) Attorney, Agent, or Firm—William J. Kubida; Hogan & Hartson LLP

(57) ABSTRACT

A measurement technique for normalizing the sensitive-axis output of a magnetoresistive (MR) sensor which greatly reduces both temperature effects and magnetic contributions from the insensitive-axis cross-terms. Specifically, the normalization techniques disclosed may be effectuated by direct measurement with no prior knowledge of the sensor constants being required and may be performed for a single sensor with multiple sensors not being required in order to estimate the cross-axis fields for each of the other sensors. The technique can additionally provide an output proportional to the insensitive-axis field as well as that of the sensitive-axis and, when combined with knowledge of ambient field strengths, can be used to determine fundamental MR sensor constants which then allows for correction of higher-order sensor non-linearities. The techniques disclosed are particularly conducive to low power supply availability applications such as battery operation.

31 Claims, 12 Drawing Sheets

OTHER PUBLICATIONS

Casselman, Thomas N., and Hanka, Steven A., "Calculation of the Performance of a Magnetoresistive Permalloy Magnetic Field Sensor", IEEE Transactions on Magnetics, vol. Mag-16, No. 2, Mar. 1980, pp. 461-464.

Stork, Thomas, "Electronic Compass Design using KMZ51 and KMZ52", Application Note AN00022, Philips Semiconductors, Systems Laboratory Hamburg, Germany, Mar. 30, 2000, pp. 1-38.

Hübschmann, Stefan and Schneider, Matthias, "Magnetoresistive Sensors", ZETEX, Application Note 20, Issue 1, Apr. 1996, pp. 1-10.

Pant, Bharat B. Ph.D. and Caruso, Mike, "Magnetic Sensor Cross-Axis Effect", AN-205, Honeywell, Apr. 1996, pp. 6.

"Applications of Magnetic Position Sensors", Application Note, AN211, Honeywell Sensor Products, Solid State Electronics Center, Jan. 2002, pp. 1-8.

"Magnetoelectronics", Chapter 2, pp. 7-34.

"Magnetic Units and Definitions", SIEMENS, Silicon Hall-Effect Sensors, Semiconductor Group, Sep. 23, 1998, pp. 1-8.

Hauser, H., Stangl, G., Fallmann, W., Chabicovsky, R., Riedling, K. "Magnetoresistive Sensors", Institut für Industrielle Elektronik und Materialwissenschaften TU Wien, Preparation, Properties, and Applications of Thin Ferromagnetic Films, Jun. 2000, pp. 1-15.

"1-and 2-Axis Magnetic Sensors", HMC1001/1002, Honeywell, Apr. 2000, pp. 1-15.

"Three-Axis Magnetoresistive Sensor", HMC1023, Honeywell, Feb. 2000, pp. 1-4.

"1 and 2-Axis Magnetic Sensors", HMC1051/HMC1052, Honeywell, Jul. 2001, pp. 1-8.

"Three-Axis Magnetic Sensor Hybrid", HMC2003, Honeywell, Oct. 1997, pp. 1-4.

"Digital Compass Module", HMR3000, Honeywell, Dec. 1999, pp. 1-4.

"Magnetic Field Sensor", KMZ10B, Data Sheet, Philips Semiconductors, Mar. 31, 1998, pp. 1-8.

"Magnetic Field Sensor", KMZ51, Data Sheet, Philips Semiconductors, Jun. 13, 2000, pp. 1-8.

"Magnetic Field Sensor", KMZ52, Data Sheet, Philips Semiconductors, Jun. 9, 2000, pp. 1-12.

"Tiny Low Power Operational Amplifier with Rail-To-Rail Input and Output", LMC7101, National Semiconductor, Sep. 1999, pp. 1-18.

"Magnetic Units", SIEMENS, Semiconductor Group, Feb. 18, 1999, p. 1.

"Magnetic Sensor Products HMC/HMR Series", Honeywell, Solid State Electronics Center, Oct. 1996, pp. 1-4.

Montaigne, Francois; Schuhl, Alain; Dau, Nguyen Van Frédéric, Encinas, Armando, Development of magnetoresistive sensors based on planar Hall effect for applications to microcompass, Sensors and Actuators 81 (2000) 324-327, Elsevier Science, 2000, pp. 324-327.

Caruso, Michael J., Bratland, Tamara, Smith, Carl H. Dr., Schneider, Robert, "A New Perspective on Magnetic Field Sensing", Honeywell, Inc. May 1998, pp. 1-19.

"General Sensor Systems", Data Sheet, Philips Semiconductors, Jan. 9, 1997, pp. 1-16.

"General Magnetoresistive sensors for magnetic field measurement", Philips Semiconductors, Sep. 6, 2000, pp. 1-74.

"General Magnetic field sensors", Data Sheet, Philip Semiconductors, Jun. 12, 1998, pp. 1-58.

"General Temperature sensors", Data Sheet, Philips Semiconductors, Dec. 5, 1996, pp. 1-18.

Dibbern, U., "The Amount of Linearization By Barber-Poles", IEEE Transactions On Magnetics, vol. Mag-20, No. 5, Sep. 1984, pp. 954-956.

Feng, J. S. Y., Romankiw, L. T., and Thompson, D. A., "Magnetic Self-Bias In The Barber Pole MR Structure", IEEE Transactions on Magnetics vol. Mag-13, No. 5, Sep. 1977, pp. 1466-1468.

Fluitman, J. H. J., "Recording Head Field Measurement With a Magnetoresistive Transducer", IEEE Transactions On Magnetics, vol. Mag-14, No. 5, Sep. 1978, pp. 433-435.

Flynn, David I., "A New Technique of Noise Reduction for Large Aspect Magnetoresistors", IEEE Transactions on Magnetics, vol. 30, No. 3, May 1994, pp. 1263-1266.

Flynn, David, "A Vector Magnetometer using a Single Permalloy Sensor with Dual Magnetic Feedback", IEEE Transactions on Magnetics, vol. 30, No. 6, Nov. 1994, pp. 5038-5041.

Hauser, H., Fulmek, P. L., Haumer, P., Vopalensky, M., Ripka, P., "Flipping field and stability in anisotropic magnetoresistive sensors", Sensors and Actuators A 106 (2003), Elsevier, pp. 121-125.

Hauser, Hans, Stangl, Günther, Hochreiter, Johann, "High-performance magnetoresistive sensors", Sensors and Actuators 81 (2000), Elsevier, pp. 27-31.

Hill, E. W. and Birtwistle, J.K., "Sputtered Permanent Magnet Arrays For MR Sensor Bias", IEEE Transactions On Magnetics, vol. Mag-23, No. 5, Sep. 1987, pp. 2419-2421.

Hill, E. W., Halter, D. S., and Birtwistle, J. K., "MR Vector Sensor with Trimmable Sense Axis Direction", IEEE Transactions on Magnetics, vol. 25, No. 5, Sep. 1989, pp. 3836-3838.

Hoffman, G. R. and Birtwistle, J. K., "Factors affecting the performance of a thin film magnetoresistive vector magnetometer", J. Appl. Phys 53 (110, Nov. 1982, pp./ 8266-8268.

Hoffman, G. R., Birtwistle, J. K. and Hill, E. W., "The Performance of Magnetoresistive Vector Magnetometers with Optimised Conductor and Anisotropy Axis Angles", IEEE Transactions on Magnetics, vol. Mag-19, No. 5, Sep. 1983, pp. 2139-2141.

Hoffman, G. R., Hill, E. W., and Birtwistle, J. K., "Thin Film Magnetoresistive Vector Sensors with Submicron Gap Width", IEEE Transactions on Magnetics, vol. Mag-20, No. 5, Sep. 1984, pp. 957-959.

Hunt, Robert P., "A Magnetoresistive Readout Transducer", IEEE Transactions on Magnetics, vol. Mag-7, No. 1, Mar. 1971, pp. 150-154.

Kaplan, Ben-Zion, Paperno, Eugene and Flynn, David I., "In-Plane Vector Magnetometer Employing a Single Unbiased Magnetoresistor", IEEE Transactions on Magnetics, vol. 34, No. 1, Jan. 1998, pp. 253-258.

Koehler, T. R., Yang, Bo, Chen, Wenjie and Fredkin, D. R., "Simulation of Magnetoresistive response in a small Permalloy strip", J. Appl. Phys. 73 (10), May 15, 1993, pp. 6504-6506.

Kuijk, K. E., van Gestel, W. J. and Gorter, F. W., "The Barber Pole, A Linear Magnetoresistive Head", IEEE Transactions on Magnetics, vol. Mag-11, No. 5, Sep. 1975, pp. 1215-1217.

Kwiatkowski, W., Stabrowski, M. and Tumánski, S., "Numerical Analysis of The Shape Anisotropy and Anisotropy Dispersion in Thin Film Permalloy Magnetoresistors", IEEE Transactions on Magnetics, vol. Mag-19, No. 6, Nov. 1983, pp. 2502-2505.

Kwiatkowski, W. Baranowski, B. and Tumänski, S., "Application of the Thin Film Permalloy Magnetoresistive Sensors in Electrical Measurements", IEEE Transactions on Magnetics, vol. Mag-20, No. 5, Sep. 1984, pp. 966-968.

Mapps, D. J., Watson, M. L. and Fry, N., "A Double Bifilar Magneto-Resistor for Earth's Field Detection", IEEE Transactions of Magnetics, vol. Mag-23, No. 5, Sep. 1987, pp. 2413-2415.

Mohri, Kaneo, Uchiyama, Tsuyoshi and Panina, Larissa V., "Recent advances of micro magnetic sensors and sensing application", Sensors and Actuators A59 (1997), Elsevier, pp. 8.

Moran, Timothy J., Dahlberg, Dan E., "Magnetoresistive sensor for weak magnetic fields", Appl. Phys. Lett. 70 (14), Apr. 7, 1997, pp. 1894-1896.

Pant, Bharat B. and Krahn, Donald R., "High-sensitivity magnetoresistive transducers", J. Appl. Phys. 69 (8), Apr. 15, 1991, pp. 5936-5938.

Pant, Bharat B., "Effect of Interstrip gap on the sensitivity of high sensitivity magnetoresistive transducers", J. Appl. Phys. 79 (8), Apr. 15, 1996, pp. 6123-6125.

Pant, Bharat B., "Scalling in thin magnetoresistive films", J. Appl. Phys. 67, (1), Jan. 1, 1990, pp. 414-419.

Paperno, Eugene, Kaplan, Ben-Zion, "Simultaneous Measurement of Two DC Magnetic Field Components by a Single Magnetoresistor", IEEE Transactions on Magnetics, vol. 31, No. 3, May 1995, pp. 2269-2273.

Kaplan, Ben-Zion, Paperno, Eugene, "New Method for Extracting Signals Generated by Magnetoresistive Sensors", IEEE Transactions on Magnetics, vol. 30, No. 6, Nov. 1994, pp. 4614-4616.

Paperno, Eugene and Kaplan, Ben-Zion, "Suppression of Barkhausen Noise in Magnetoresistive Sensors Employing AC Bias", IEEE Transactions on Magnetics, vol. 31, No. 6, Nov. 1995, pp. 3161-3163.

Ripka, P., "Alternating current excited magnetoresistive sensor", J. Appl. Phys. 79 (8), Apr. 15, 1996, pp. 5211-5213.

Soohoo, R. F., "Repeatability of Barkhausen Transitions in Thin Films", IEEE Transactions on Magnetics, vol. 30, No. 1, Jan. 1994, pp. 23-25.

Tsang, C. and Decker, S. K., "The origin of Barkhausen noise in small permalloy magnetoresistive sensors", J. Appl. Phys. 52 (3), Mar. 1981, pp. 2465-2467.

Tumänski, S., "A New Type of Thin Film Magnetoresistive Magnetometer—An Analysis of Circuit Principles", IEEE Transactions on Magnetics, vol. Mag-20, No. 5, Sep. 1984, pp. 1720-1722.

Tumänski, S., Stabrowski, M. M., "Optimization of the Performance of a Thin Film Permalloy Magnetoresistive Sensor", IEEE Transactions on Magnetics, vol. Mag-20, No. 5, Sep. 1984, pp. 963-965.

Sosa, M., Carneiro, A. A. O., Baffa, O., Colafemina, J. F., "Human ear tympanum oscillation recorded using a magnetoresistive sensor", Review of Scientific Instruments, vol. 73, No. 10, Oct. 2002, pp. 3695,3697.

Ueda, M., Endoh, M., Yuoda, H. and Wakatsuki, N., "AC Bias Type Magnetoresistive Sensor", IEEE Transactions on Magnetics, vol. 26, No. 5, Sep. 1990, pp. 1572-1574.

Vicent, J. L., "The development of a sinusoidal voltage in thin ferromagnetic films and the measurement of low magnetic fields", J. Phys. D: Appl. Phys., vol. 11, 1978, pp. L29-L31.

de Niet, E. and Vreeken, R., "A Magnetoresistive Head with Magnetic Feedback", IEEE Transactions on Magnetics, vol. Mag-15, No. 6, Nov. 1979, pp. 1625-1627.

Yeh, Tangshium and Witcraft, William F., "Effect of Magnetic Anisotropy on Signal and Noise of NiFe Magnetoresistive Sensor", IEEE Transactions on Magnetics, vol. 31, No. 6, Nov. 1995, pp. 3131-3133.

* cited by examiner

MAGNETORESISTIVE (MR) SENSOR TEMPERATURE COMPENSATION AND MAGNETIC CROSS-TERM REDUCTION TECHNIQUES UTILIZING SELECTIVE SET AND RESET GAIN MEASUREMENTS

COPYRIGHT NOTICE/PERMISSION

A portion of the disclosure of this patent document contains material which is subject to copyright protection. The copyright owner has no objection to the facsimile reproduction by anyone of the patent document of the patent disclosure as it appears in the United States Patent and Trademark Office patent file or records, but otherwise, reserves all copyright rights. The following notice applies to the software and data and described below, inclusive of the drawing figures where applicable: Copyright © 2003 Laser Technology, Inc.

BACKGROUND OF THE INVENTION

The present invention relates, in general, to the field of magnetoresistive (MR) sensors and the utilization of the same as magnetometers and magnetic compasses. More particularly, the present invention relates to effective, simplified and highly accurate techniques for MR sensor temperature compensation and magnetic cross-term reduction in conjunction with conventional magnetoresistive sensor designs.

There are a number of conventional magnetic sensor designs and techniques for utilizing them in compassing, navigational systems and other applications currently available. In this regard, representative references include: Caruso et al., "A New Perspective on Magnetic Field Sensing" published by Honeywell, Inc. May, 1998 (hereinafter "New Perspectives"); a Honeywell Sensor Products Datasheet for the HMC1001/1002 and HMC1021/1022 1- and 2-Axis Magnetic Sensors published April, 2000 (hereinafter "Honeywell Datasheet"); a Honeywell Application Note AN-205 entitled *"Magnetic Sensor Cross-Axis Effect"* by Pant, Bharat B. (hereinafter "AN-205"); and a Philips Semiconductors publication entitled: "Magnetoresistive Sensors for Magnetic Field Measurement", published Sep. 6, 2000 (hereinafter "Philips Publication"). The disclosures of these references are herein specifically incorporated by this reference in their entirety.

Specifically, the New Perspectives document provides an overview of magnetoresistive and other magnetic sensing technologies while the Honeywell Datasheet provides a detailed description of the particular MR sensors as may be utilized in a representative embodiment of the present invention disclosed herein. The AN-205 application note describes conventional techniques for the elimination of magnetic cross-terms in magnetoresistive sensors while the Philips Publication provides a detailed description of MR sensor functionality including relevant mathematics.

SUMMARY OF THE INVENTION

Disclosed herein is a measurement technique used to normalize the sensitive-axis output of a MR sensor which greatly reduces both temperature effects and magnetic contributions from the insensitive-axis cross-terms. Among other significant advantages of the normalization technique disclosed are: a) it may be effectuated by direct measurement with no prior knowledge of the sensor constants being required; b) the technique may be performed for a single sensor and multiple sensors are not needed in order to estimate the cross-axis fields for each of the other sensors; c) the technique can additionally provide an output proportional to the insensitive-axis field as well as that of the sensitive-axis; d) when combined with knowledge of ambient field strengths, the technique can be used to determine fundamental MR sensor constants which then allows for correction of higher-order sensor non-linearities; and e) the technique is conducive to low power supply availability applications such as battery operation.

Particularly disclosed herein is a method for normalizing an output of the sensitive axis of a magnetic sensor having SET/RESET/OFFSET field generating elements. The output is substantially determined by a method comprising: sampling a number of SET outputs of the sensor to produce a first sum; sampling a number of RESET outputs of the sensor to produce a second sum; sampling a number of SET gains of the sensor to produce a third sum; sampling a number of RESET gains of the sensor to produce a fourth sum; subtracting the second sum from the first sum to produce a first result; subtracting the fourth sum from the third sum to produce a second result; and dividing the first result by the second result.

Further disclosed herein is a method for determining the cross-axis output of the insensitive axis of a magnetic sensor having SET/RESET/OFFSET field generating elements. The cross-axis output is substantially determined by: sampling a number of SET gains of the sensor to produce a first sum; sampling a number of RESET gains of the sensor to produce a second sum; adding the first sum to the second sum to produce a first result; subtracting the second sum from the first sum to produce a second result; and dividing the first result by the second result.

Also disclosed herein is a method for normalizing an output of the sensitive axis of a magnetic sensor having SET/RESET and OFFSET field generating elements. The output is substantially determined by a method comprising: furnishing a pulse having a first direction to the SET/RESET field generating element to establish a SET magnetic state; sampling an output of the magnetic sensor to establish a SET magnetic output; providing a pulse having the first direction to the OFFSET field generating element; sampling the output of the magnetic sensor to establish a first sample; providing another pulse having a second direction opposite to the first direction to the OFFSET field generating element; further sampling the output of the magnetic sensor to establish a second sample; and subtracting the second sample from the first sample to establish a SET gain.

Also further disclosed herein is a circuit comprising: a magnetic sensor having first and second terminals thereof; SET/RESET field generating elements disposed at a first location with respect to the magnetic sensor; OFFSET field generating elements disposed at a second location with respect to the magnetic sensor so as to generate a field orthogonal to that generated by the SET/RESET field generating elements; an amplifier coupled to the first and second terminals of the magnetic sensor and having an output thereof; an A/D converter coupled to the output of the amplifier for producing a control signal; a SET/RESET pulse generator coupled to the SET/RESET field generating elements; an OFFSET generator coupled to the OFFSET field generating elements; and a control block adapted to receive the control signal from the A/D converter and providing control output signals to the SET/RESET pulse generator and the OFFSET generator.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 12A and 12B show the effects that sensitive and cross-axis fields have on the SET-RESET gain difference wherein FIG. 12A illustrates that the normalized SET-RESET gain increases with the applied cross-axis field and FIG. 12B illustrates that the normalized SET-RESET gain difference decreases with the sensitive-axis field.

DESCRIPTION OF A REPRESENTATIVE EMBODIMENT

Figure 1:
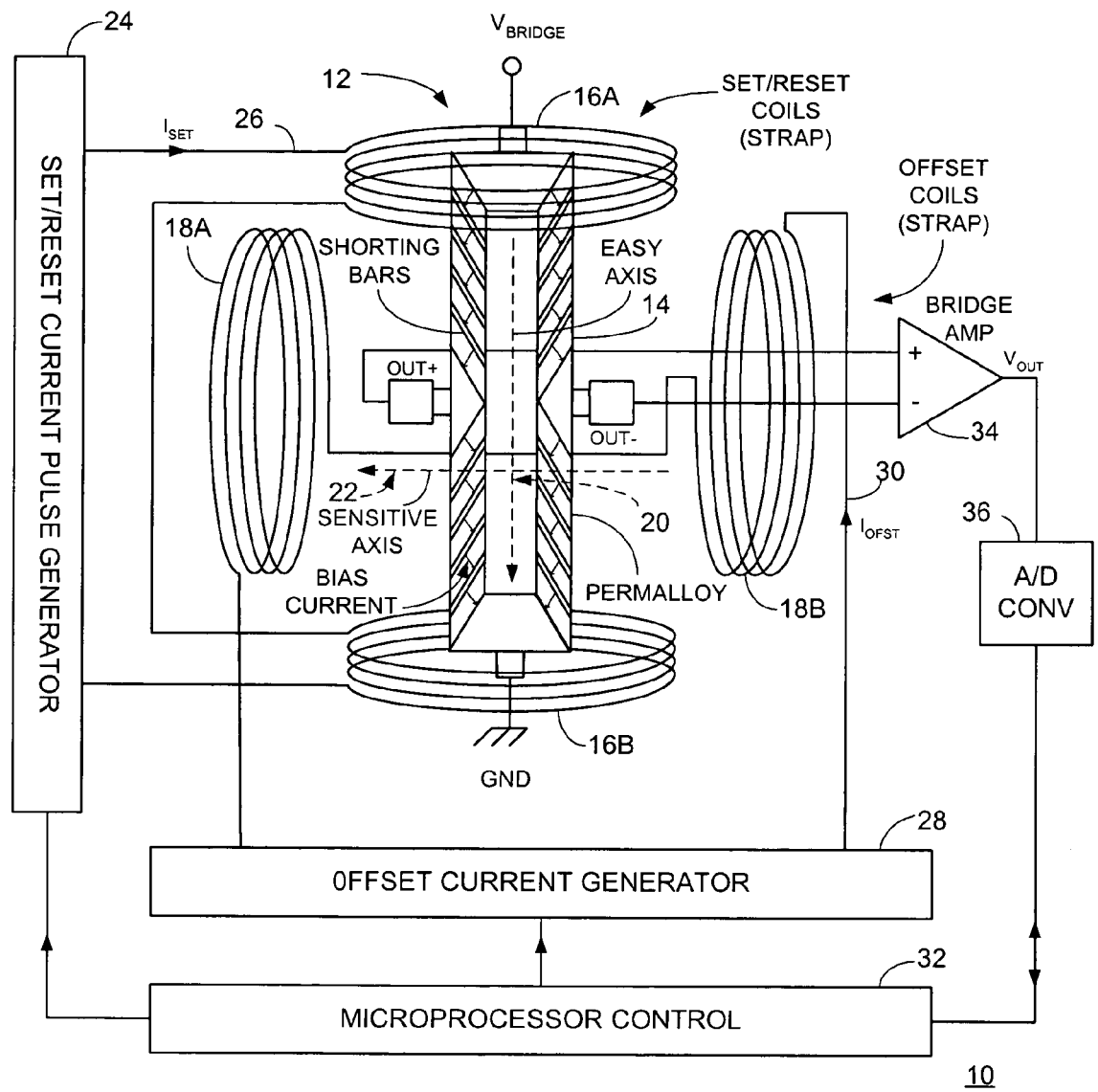
FIG. 1 is a simplified representation of an MR bridge utilizing SET/RESET and OFFSET coils (or straps) to effectuate the magnetoresistive sensor temperature compensation and magnetic cross-term reduction techniques of the present invention.

With reference now to FIG. 1, a schematic representation of a 'barber-pole' type magnetoresistive (MR) bridge 10 is shown, along with the coils (or straps) 16A, 16B, 18A and 18B used to generate both the SET/RESET and OFFSET fields in order to effectuate the magnetoresistive sensor 12 temperature compensation and magnetic cross-term reduction techniques of the present invention.

The sensor 12, in general, comprises a substantially elongate permalloy body portion 14 which includes a number of shorting bars between which are induced a bias current in the direction indicated by the arrows. The sensor 12, in conjunction with the opposing SET/RESET coils (or straps) 16A and 16B and OFFSET coils (or straps) 18A and 18B defines an easy axis 20 extending between the coils 16A and 16B and a sensitive axis 22 extending between the coils 18A and 18B. The MR bridge 10 may be, in a representative embodiment, coupled between a voltage $V_{BRIDGE}$ and circuit ground as shown.

In accordance with the present invention, the MR bridge 10 further includes a SET/RESET current pulse generator 24 for applying a current $I_{SET}$ on line 26 to the series coupled SET/RESET coils 16A and 16B as will be more fully described hereinafter. Similarly, an OFFSET current generator 28 supplies a current $I_{OFST}$ on line 30 to the series coupled OFFSET coils 18A and 18B as will also be more fully described hereinafter. The function of the SET/RESET current pulse generator 24 and OFFSET current generator 28 is in accordance with direction received from a microprocessor control block 32. Positive and negative output from the sensor 12 is supplied to a bridge amplifier 34 which produces a voltage output $V_{OUT}$ for input to an analog-to-digital (A/D) converter 36 which is, in turn, coupled to the microprocessor control block 32.

Although illustrated as such for sake of simplicity, in practice, actual coils are seldom used. Instead conductive straps are integrated directly onto the MR chip to serve as the field generators and the coils are utilized in this figure to illustrate field directions, via the right-hand rule, generated by specific currents. The circuit shown is only a representative topology implemented in the form of a constant-voltage bridge and it should be noted that a constant-current bridge configuration may also be implemented (or a design utilizing a combination of voltage and current methods) which may also be used to effectuate the sensor temperature compensation and magnetic cross-term reduction technique of the present invention.

With particular reference to AN-205, an experimentally verified representation for a "barber-pole" MR bridge sensor output, valid for either a constant-voltage or constant-current bridge, is given by equation (1) on page 1:

$$V_{OUT}=(a\,H)/(Hs+Hca),$$

where 'Vos', the (null) offset, has been removed;
'H' is the sensitive-axis field;
'Hca' is the cross-axis field;
'a' is a function of the anisotropic magnetoresistance constant, '$\Delta\rho/\rho$', and bulk resistivity '$\rho$'; and
'Hs=Hk+Hd' is a sensor constant (denominated as
'Ho' by the Philips Publication), equal to the sum of the anisotropy and demagnetizing fields.

Typically, '$\Delta\rho/\rho$' and '$\rho$' are the dominant sources of temperature variation, while 'Ho' varies weakly with temperature due to the small temperature dependency of 'Hk'.

Hence it is mathematically useful the generalize the AN-205 expression for $V_{OUT}$ into the following form:

$V_{OUT} = C0 + C1[T]FH[H,Hca,Ho]$, where

'C0' is derived from a now restored 'Vos'; C1[T] is a function of temperature dependent on circuit topology combined with '($\Delta\rho/\rho$) [T]' and '$\rho$[T]'; 'Ho' is now considered independent of temperature unless otherwise noted or inferred; and 'FH[H,Hca,Ho]' represents some approximation for the actual magnetic form-factor of a 'barber-pole' magnetoresistor, which cannot be written in closed form, but can be solved numerically.

The magnetic form-factor specifically associated with the AN-205 application note 'Vout' approximation is well suited to illustrating the techniques of the present invention, as it is simple enough to allow meaningful symbolic expressions to be derived:

$FH[H,Hca,Ho] \approx (H/(Hca+Ho))$ [AN-205 Form-Factor]

Note also the form-factors for the SET and RESET magnetic states are generally derived by changing the sign changes of 'Ho' (+Ho for SET state, and –Ho for RESET state):

FH[H,Hca,+Ho] for the 'SET' magnetic state
FH[H,Hca,–Ho] for the 'RESET' magnetic state As shown, a current pulse '$I_{SET}$' injected into the SET/RESET coils 16A, 16B on line 26 will generate a domain aligning field parallel with the 'easy-axis' 20 vector, placing the MR bridge 10 is the SET magnetic state. Conversely, a current pulse in the opposite direction generates a field anti-parallel to the easy-axis 20, toggling the bridge 10 to the RESET magnetic state. When in the SET state, the MR bridge 10 produces a positive voltage with respect to the zero-field bridge OFFSET voltage, '$V_{OS}$', for fields parallel to the sensitive-axis 22. When toggled to the RESET state, '$V_{OUT}$' will go negative with respect to '$V_{OS}$' by approximately the same amount.

The OFFSET coils 18A, 18B are used to perturb the ambient sensitive-axis 22 field in order to make differential gain measurements about that field point. A small current '$I_{OFST}$' injected into the OFFSET coils 18A and 18B on line 30 will augment the sensitive axis 22 field, and a current pulse in the opposite direction will retard the sensitive axis 22 field.

These differential gain measurements, when mathematically combined with the ambient field measurements, allow for the creation of a normalized sensitive-axis 22 output in which both temperature and magnetic contributions from the insensitive-axis (aligned with the 'easy'-axis 20) are greatly reduced.

Figure 2:
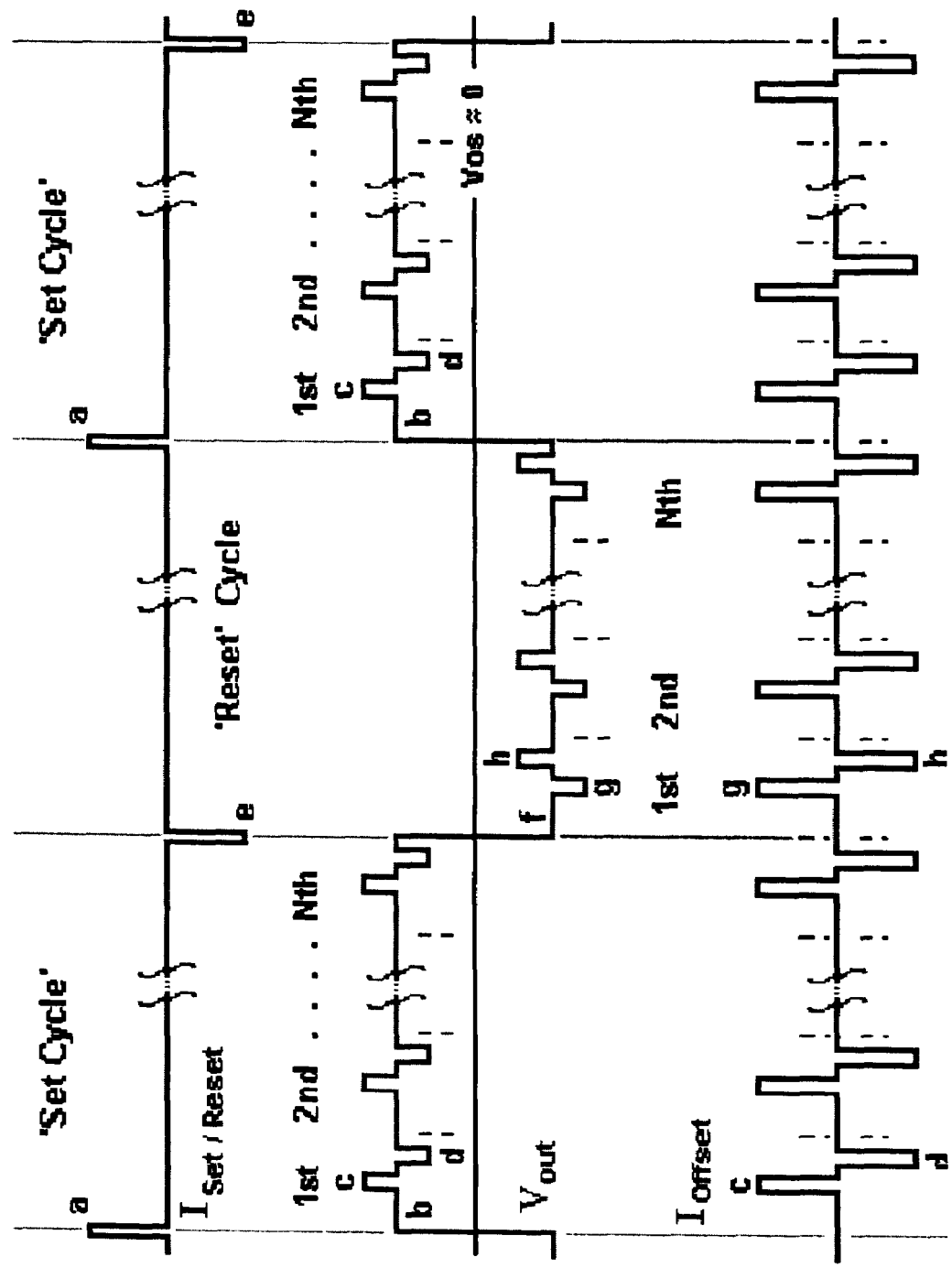
FIG. 2 illustrates one realization of a SET/RESET measurement cycle as utilized to normalize the output of an MR sensor in accordance with the technique of the present invention.

With reference additionally now to FIG. 2, one realization of a SET/RESET measurement cycle is shown as may be used to normalize the output of a MR sensor 10 (FIG. 1) in accordance with the technique of the present invention. Key timing events are labeled with lowercase letters "a" through "h" inclusive and substantially correspond to the similarly labeled paragraphs describing the activity described in greater detail hereinafter. It should be noted that different sampling schemes, including those having: a) different sampling orders and '$I_{OFST}$' values to determine differential gains; and/or b) different numbers of gain versus output samples per measurement block are also feasible and that the illustration shown is intended to be representative only.

It should be also noted that the '$V_{OUT}$' waveform depicted in FIG. 2 is consistent with an ambient field aligned parallel with the sensitive-axis field vector 22 of sensor 10, as shown in the preceding figure. Particularly illustrated for 'N'=1, as shown in FIG. 2, is that:

a) The SET/RESET pulse generator 24 delivers a positive-going current pulse to the SET/RESET strap (or coils 16A, 16B), which places the MR bridge 10 in the SET magnetic state.

b) After delaying for amplifier 34 settling time (which proceeds all A/D readings made after a change in magnetic state), the A/D converter 36 samples $V_{OUT}$ while the OFFSET strap (or coils 18A, 18B) current $I_{OFST}$ equals zero. This reading is defined as the SET magnetic output:

$Vmag\_set \equiv C0+C1[T]\ FH[H+0,Hca,+Ho]$ c) The OFFSET current generator 28 is turned on, augmenting the sensitive-axis 22 magnetic field by '+dH'. After a sufficient delay, the first of two A/D samples needed to find the SET gain is taken:

$Vgp\_set \equiv C0+C1[T]FH[H+dH,Hca,+Ho]$ d) The OFFSET strap current $I_{OFST}$ is reversed (current zeroing before reversal is not required), this time retarding the sensitive axis 22 field by '–dH'. The second A/D sample is then taken:

$Vgn\_set \equiv C0+C1[T]FH[H-dH,Hca,+Ho]$

The second sample is subtracted from the first to determine the SET gain:

$$Vgain\_set \equiv Vgp\_set - Vgn\_set$$
$$= C1[T]Gset[H, Hca, Ho, dH],$$

where function $Gset[H,Hca,Ho,dH] \equiv FH[H+dH,Hca,+Ho]-FH[H-dH,Hca,+Ho]$ is only dependent on magnetic parameters. Note that the subtraction also cancelled the 'C0' term.

The RESET measurement cycle (also illustrated in this figure) is similar to the SET cycle in that:

e) The SET/RESET strap 16 is now pulsed with a negative going current $I_{SET}$, toggling the MR bridge 10 to the magnetic RESET condition.

f) Again with zero OFFSET strap current, the RESET magnetic output is sampled by the A/D converter 36:

$Vmag\_rset \equiv C0+C1[T]FH[H+0,Hca,-Ho]$ g) The OFFSET strap 18 is again energized to augment the sensitive axis field by '+dH', and the first of two A/D samples needed to find the RESET gain is made:

$Vgp\_rset \equiv C0+C1[T]FH[H+dH,Hca,-Ho]$ h) The OFFSET strap current $I_{OFST}$ is reversed, and the second A/D sample is taken:

$Vgn\_rset \equiv C0+C1[T]\ FH[H-dH,Hca,-Ho]$

The second sample is subtracted from the first to determine the RESET gain:

$$Vgain\_rset \equiv Vgp\_rset - Vgn\_rset$$
$$= C1[T]Grset[H, Hca, Ho, dH],$$

where function $$Grset[H,Hca,Ho,dH] \equiv FH[H+dH,Hca,-Ho]-FH[H-dH,Hca,-Ho]$$

is again only dependent on magnetic parameters.

After a SET and RESET measurement cycle pair has completed, the normalized (but unscaled) output for the sensitive axis 22 can is defined by the following formula:

$$\text{Sensitive-Axis Output} \equiv Usen \equiv \frac{Vmag\_diff}{Vgain\_diff}$$

$$= \frac{Vmag\_set + Vmag\_rst}{Vgain\_set - Vgain\_rst}$$

The normalized (also unscaled) output for insensitive or cross-axis 20 is defined here as well:

$$\text{Cross-Axis Output} = Ucrs \equiv \frac{Vgain\_sum}{Vgain\_diff}$$

$$= \frac{Vgain\_set + Vgain\_rst}{Vgain\_set - Vgain\_rst}$$

The denominator of both the sensitive-axis and cross-axis output terms is the difference between the SET and RESET gains:

$$Vgain\_diff = Vgain\_set - Vgain\_rset$$

$$= C1[T] \, Gdiff[H, Hca, Ho, dH],$$

where function $$Gdiff[H,Hca,Ho,dH] \equiv Gset[H,Hca,Ho,dH]-Grset[H,Hca,Ho,dH]$$

is only dependent on magnetic parameters.

The numerator of the cross-axis output term is the sum of the SET and RESET gains:

$$Vgain\_sum = Vgain\_set + Vgain\_rset$$

$$= C1[T] \, Gdiff[H, Hca, Ho, dH],$$

where function $$Gsum[H,Hca,Ho,dH] \equiv Gset[H,Hca,Ho,dH]+Grset[H,Hca,Ho,dH]$$

is only dependent on magnetic parameters.

The numerator of the sensitive-axis output term is the difference between the SET and RESET magnetic outputs:

$$Vmag\_diff = Vmag\_set - Vmag\_rset$$

$$= C1[T] \, Mdiff[H, Hca, Ho, dH],$$

where function $$Mdiff[H,Hca,Ho,dH] \equiv FH[H,Hca,+Ho]-FH[H,Hca,-Ho]$$

is only dependent on magnetic parameters. Note again the cancellation of the 'C0' term.

The sensitive-axis output only depends on magnetic parameters 'Ho' and 'dH', as the temperature function, '$C1[T]=C1[(\Delta\rho/\rho)[T], \rho[T]]$', cancels from both numerator and denominator:

$$Usen = \frac{C1[T] * Mdiff[H, ..., dH]}{C1[T] * Gdiff[H, ..., dH]} = \frac{Mdiff[H, Hca, Ho, dH]}{Gdiff[H, Hca, Ho, dH]}$$

Fixed scale-factors associated with '$C1[T]$' also cancel, making 'Usen' scale independent. Similar cancellations occur for the cross-axis expression:

$$Ucrs = \frac{C1[T] * Gsum[H, ..., dH]}{C1[T] * Gdiff[H, ..., dH]} = \frac{Gsum[H, Hca, Ho, dH]}{Gdiff[H, Hca, Ho, dH]}$$

Specifically for the AN-205 application note 'Vout' approximation, the equations for the sensitive and cross-axis outputs are now derived:

1) Again, the magnetic form-factor approximation equals:

$$FH[H,Hca,Ho] \cong (H/(Hca+Ho))$$

2) The SET magnetic output equals:

$$Vmag\_set = C0 + C1[T](H/(Hca+Ho)), \text{ which is greater than } C0 \text{ for } |Hca|<Ho$$

3) The SET gain equals:

$$Gset[H, Hca, Ho, dH] = FH[H + dH, Hca, -Ho] -$$
$$FH[H - dH, Hca, -Ho]$$
$$= (H + dH)/(Hca + Ho) -$$
$$(H - dH)/(Hca + Ho)$$
$$= (2dH)/(Hca + Ho), \text{ and}$$

$$Vgain\_set = C1[T]((2\ dH)/(Hca + Ho)),$$

positive quantity for |Hca|<Ho

4) The RESET magnetic output equals:

$$Vmag\_rset = C0 + C1[T](-H/(Ho-Hca)), \text{ (which is less than } C0 \text{ for } |Hca|<Ho)$$

5) The RESET gain equals:

$$Grset[H, Hca, Ho, dH] = FH[H + dH, Hca, -Ho] -$$
$$FH[H - dH, Hca, -Ho]$$
$$= (H + dH)/(Hca - Ho) -$$
$$(H - dH)/(Hca - Ho)$$
$$= (-2\ dH)/(Ho - Hca), \text{ and}$$

$$Vgain\_rset = C1[T] * (-2\ dH)/(Ho - Hca),$$

(an always negative quantity for |Hca|<Ho)

6) The SET gain−RESET gain difference equals:

$$Gdiff[H, Hca, Ho, dH] = Gset[H, Hca, Ho, dH] - Grset[H, Hca, Ho, dH]$$
$$= (2\ dH)/(Hca + Ho) +$$
$$(2\ dH)/(Ho - Hca)$$
$$= (4\ Ho\ dH)/(Ho^2 - Hca^2), \text{ and}$$

$$V\text{gain\_diff} = CI[T] * ((4\ Ho\ dH)/(Ho^2 - Hca^2))$$

7) The SET gain+RESET gain sum equals:

$$Gsum[H, Hca, Ho, dH] = Gset[H, Hca, Ho, dH] + Grset[H, Hca, Ho, dH]$$
$$= (2\ dH)/(Hca + Ho) -$$
$$(2\ dH)/(Ho - Hca)$$
$$= (-4\ dH\ Hca)/(Ho^2 - Hca^2), \text{ and}$$

$$V\text{gain\_sum} = CI[T] * ((-4\ dH\ Hca)/(Ho^2 - Hca^2))$$

8) The SET magnetic output−RESET magnetic output equals:

$$Mdiff[H, Hca, Ho, dH] = FH[H, Hca, +Ho] - FH[H, Hca, -Ho]$$
$$= ((H/(Hca + Ho)) -$$
$$(H/(Hca - Ho))$$
$$= (2\ Ho\ H)/(Ho^2 - Hca^2), \text{ and}$$

$$V\text{mag\_diff} = CI[T] * ((2Ho\ H)/(Ho^2 - Hca^2))$$

9) The sensitive-axis output, 'Usen' is seen to be proportional only to 'H', as the 'Ho/(Ho²−Hca²)' term common to both numerator and denominator cancel:

$$Usen = \frac{Mdiff[H, \ldots, dH]}{Gdiff[H, \ldots, dH]}$$
$$= \frac{(2 \cdot Ho \cdot H)/(Ho^2 - Hca^2)}{(4 \cdot Ho \cdot dH)/(Ho^2 - Hca^2)}$$
$$= \frac{H}{(2*dH)}$$

As the constant of proportionality, '1/(2 dH)', contains no 'Ho' terms, 'Usen' is also independent of magnetic parameter temperature dependencies. Given that OFFSET strap geometry is fixed, the precision of 'dH' is determined directly by 'Iofst'.

10) The cross-axis output, 'Ucrs' is seen to proportional only to 'Hca', as the 'Ho/(Ho²−Hca²)' term common to both numerator and denominator cancel. Given that constant of proportionality equals '−(1/Ho)', the temperature dependency of 'Ucrs' should be equal to or less than the temperature variation of the anisotropy field, 'Hk':

$$Ucrs = \frac{Gsum[H, \ldots, dH]}{Gdiff[H, \ldots, dH]}$$
$$= \frac{(-4 \cdot dH \cdot Hca)/(Ho^2 - Hca^2)}{(4 \cdot Ho \cdot dH)/(Ho^2 - Hca^2)}$$
$$= \frac{Hca}{(-Ho)}$$

All equations can be generalized to multiple samples by replacing individual quantities with the appropriate averages. Also, the number of gain samples per SET/RESET cycle need not equal the number of magnetic output samples. Let the magnetic output samples per SET/RESET cycle (steps (b) and (f)) be repeated 'N' times, the number of gains taken per SET/RESET cycle (steps (c)–(d) and steps (g)–(h)) be repeated 'M' times (FIG. 2 is drawn for 'M'='N'). The numbers of samples 'N' and 'M' taken per SET or RESET cycle, as well as the sampling rate, are implementation specific and dependent on the microprocessor speed of the microprocessor control block 32 and signal filtering requirements.

The averaged sensitive-axis output equation has a new scaling constant that manifests when 'N'≠'M':

$$Usen \cong \left(\frac{N}{M}\right) \cdot \frac{H}{(2 \cdot dH)} \cong \frac{\sum_1^N (\text{Set Outputs}) - \sum_1^N (\text{Reset Outputs})}{\sum_1^M (\text{Set Gains}) - \sum_1^M (\text{Reset Gains})}$$

The averaged cross-axis equation has no additional scaling constant because the 'M' terms common to both numerator and denominator cancel:

$$Ucrs \cong \frac{Hca}{(-Ho)} \cong \frac{\sum (\text{Set Gains}) + \sum (\text{Reset Gains})}{\sum (\text{Set Gains}) - \sum (\text{Reset Gains})}$$

Scaled sensitive and cross-axis equations are found by multiplying by the appropriate constants of proportionality:

$$Hsen \cong (M/N)(2\ dH)\ Usen, \text{ and}$$

$$Hcrs \cong (-Ho)\ Ucrs$$

The sensitive/cross-axis output streams are updated as subsequent SET/RESET blocks become available.

Figure 7:
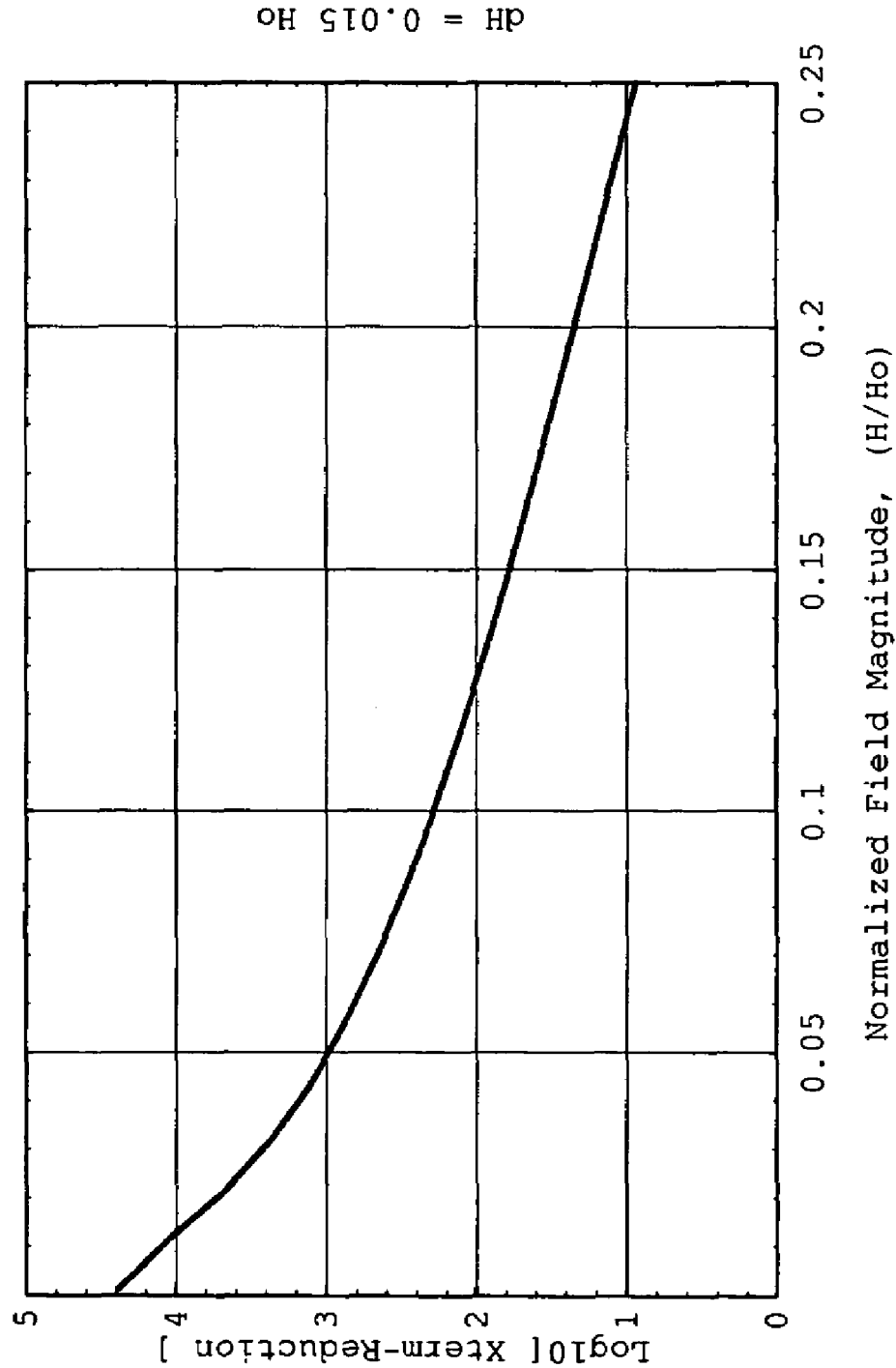
FIG. 7 illustrates the expected cross-term reduction, due to implementation of the techniques of the present invention, for a representative sensor with the plot being semi-logarithmic and with the independent axis being the normalized sensitive-axis field (H/Ho)

With reference additionally now to FIG. 7, the expected cross-term reduction, which result from implementation of the techniques of the present invention, is plotted against the normalized sensitive-axis field, (H/Ho). The plot was generated via numerical simulation using constants for a representative sensor ('Ho'=8 Gauss, maximum field range=2 Gauss, and 'dH'=0.12 Gauss). Note that for (H/Ho)<0.075 (small fields), the amount cross-term reduction begins to peak as (H/Ho) approaches zero, which is illustrative of the influence of 'dH'. For larger fields, the amount of cross-term reduction decreases in an approximately logarithmic manner.

Finally, since 'dH' and 'Ho' are constants of proportionality, they can be found directly if the sensitive and cross-axis fields are known. A simple calibration to determine these constants will be discussed, and once known, 'dH' and 'Ho' then can be used to calibrate the reported field values to specific units and be available for utilization in correcting for higher-order non-linearities.

To illustrate a representative linearization, the scaled sensitive-axis output, 'Hsen', is first constructed using the 'dH' determined from calibration.

$$Hsen \cong H \cong \left(\frac{M}{N} \cdot (2 \cdot dH)\right) \cdot \frac{\sum_1^N (\text{Set Outputs}) - \sum_1^N (\text{Reset Outputs})}{\sum_1^M (\text{Set Gains}) - \sum_1^M (\text{Reset Gains})}$$

Next, as will be shown hereinafter in greater detail, 'Hsen' need generally be processed through a simple function of itself and a calibrated value for 'Ho' to accomplish a significant linearization of 'Hsen':

$$H_{Calibrated} \cong Hsen - (1/Ho^2) \cdot (Hsen^3)$$

Figure 8:
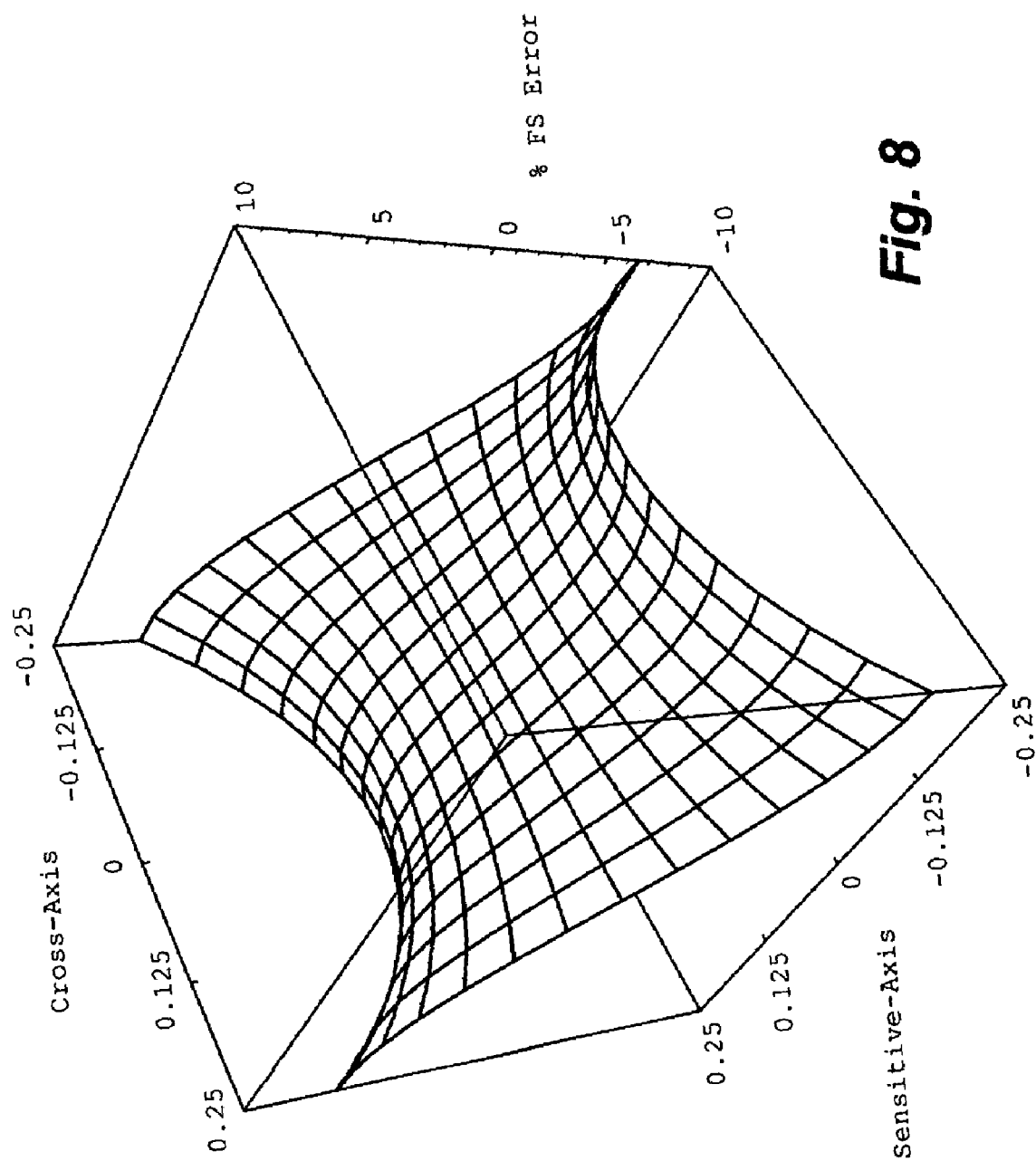
FIG. 8 shows a three-dimensional plot illustrating the percentage of full-scale error, as compared to the normalized true sensitive-axis field for a SET-RESET magnetic output calibrated to a full-scale field of '0.25 Ho' and wherein the plot range also covers this full-scale field value for both the sensitive and cross-axes.
Figure 9:
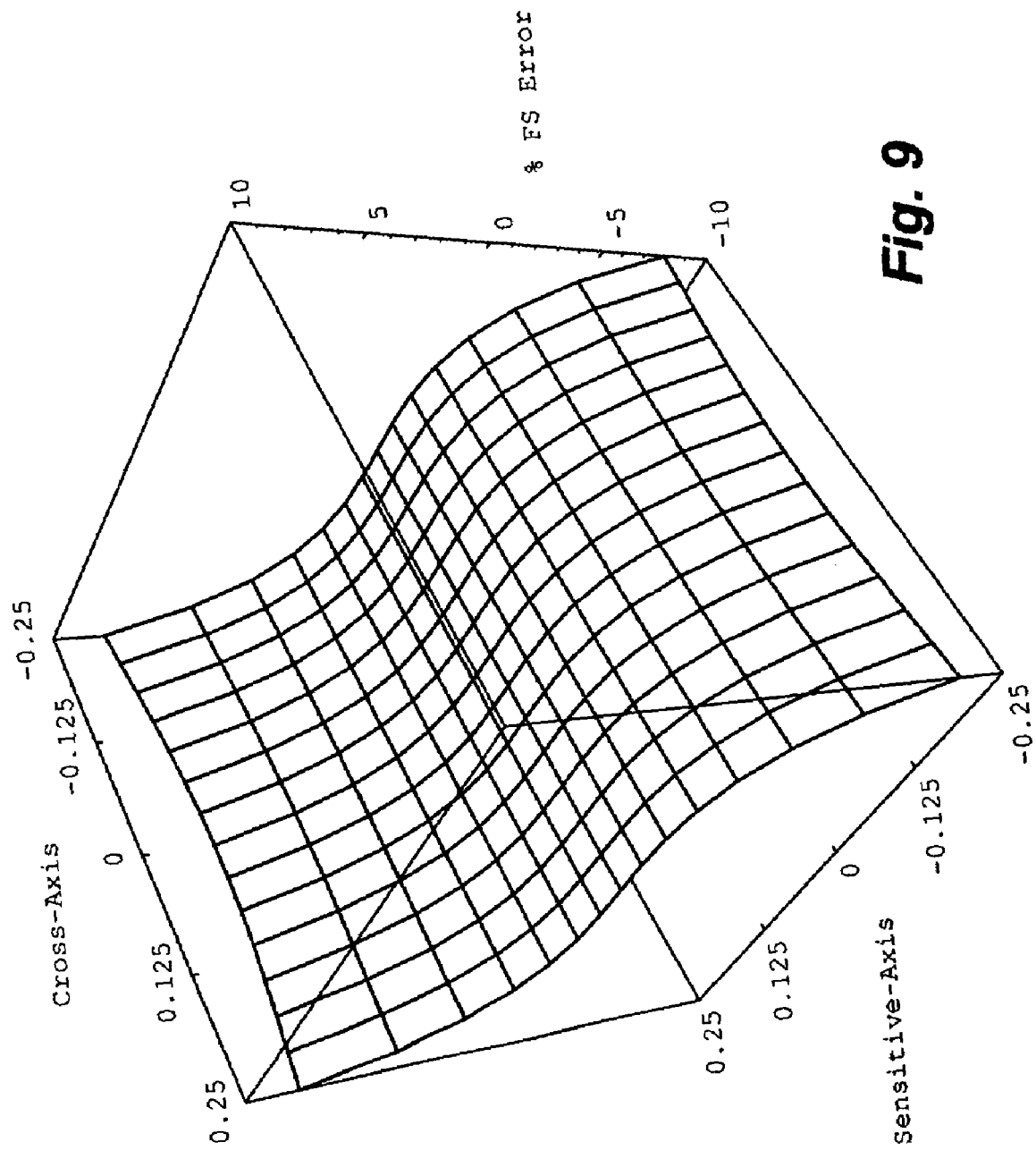
FIG. 9 shows a three-dimensional plot illustrating the percentage error for 'scaled' sensitive-axis output created using the techniques of the present invention and wherein the plot range and error scaling is as in the preceding figure.
Figure 10:
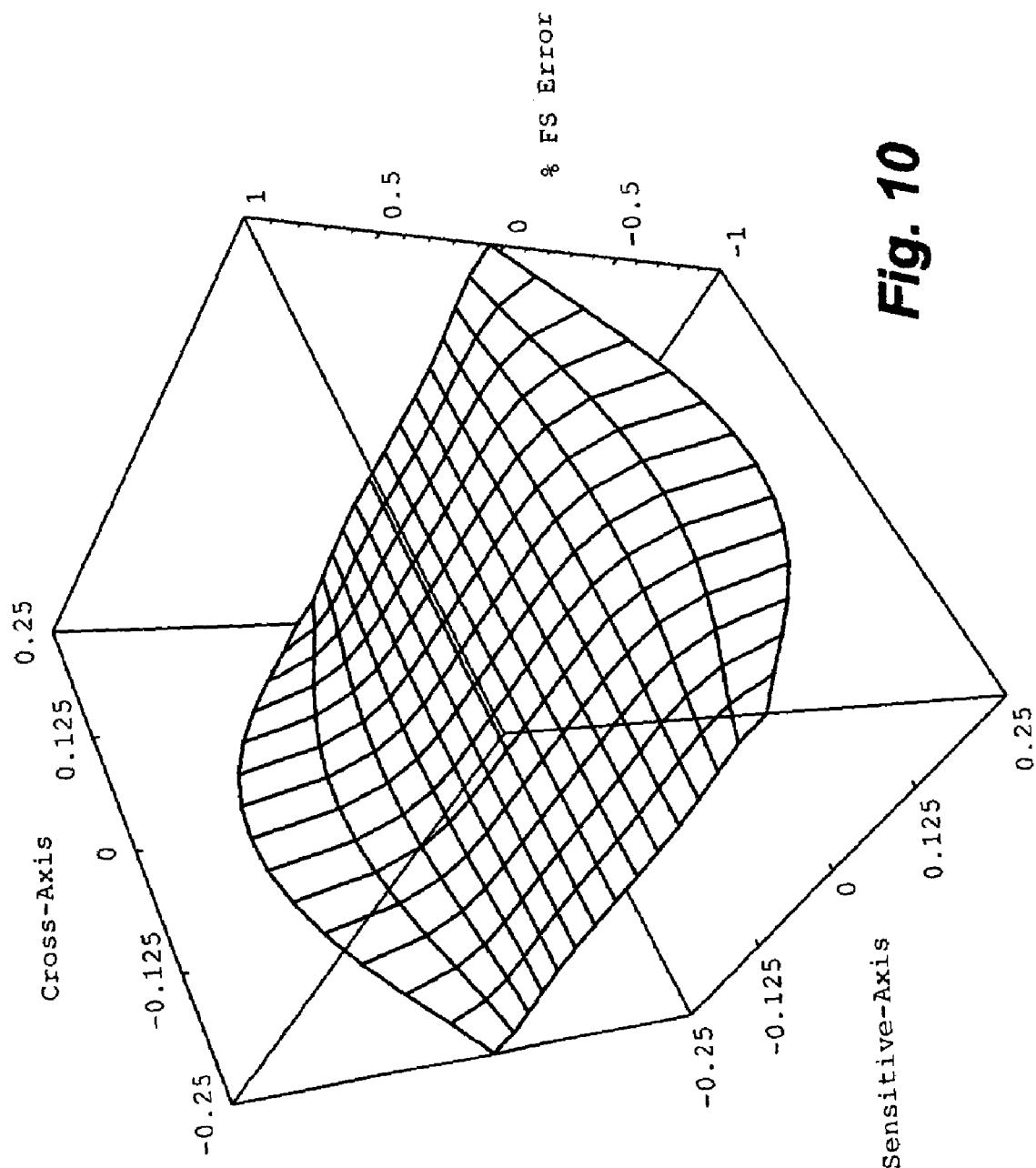
FIG. 10 show a three-dimensional plot illustrating the percentage of full-scale error, as compared to the normalized true sensitive-axis field, for the 'scaled' and 'linearized' sensitive-axis output created using the techniques of the present invention and wherein the plot range is as in the preceding two figures.

Now with particular reference additionally now to FIGS. 8, 9, and 10, each of these figures shows a three-dimensional plot showing the percentage of full-scale error, as compared to the true sensitive-axis field, for a specific sensitive-axis output:

$$\% \text{ FS Error} = 100 \cdot \frac{(\text{Output}/Ho) - (H_{True}/Ho)}{(H_{FullScale}/Ho)}$$

All field values are normalized to the MR sensor constant, 'Ho', to allow for generalized comparisons between sensors. Both the sensitive and cross-axis ranges, as well as the error normalization constant, have been set to a representative maximum (full-scale) field value of '0.25 Ho'.

With specific reference to FIG. 8, the percentage error of the SET-RESET magnetic output, 'calibrated' also to a (H/Ho) value of 0.25, is shown. Note this error varies significantly with both sensitive and cross-axis field.

With particular reference to FIG. 9, the percentage error of the scaled sensitive-axis output, 'Hsen' is shown. Note that error variation with cross-axis field has been greatly reduced, while the sensitive-axis error has been redistributed towards the larger field values, as compared to the previous figure.

With particular reference to FIG. 10, the percentage error of a 'scaled' and 'linearized' sensitive-axis output is illustrated. Here the error variation;

i) Has been reduced by an order of magnitude, as compared to FIG. 9, for the sensitive-axis field extremes; and
ii) Diminishes rapidly towards zero as both the sensitive and cross-axis fields magnitudes are reduced.

The actual error variation depends mainly on how accurately 'dH' can be determined, and to a lesser degree, 'Ho'.

The following is an overview of a SET/RESET output normalization technique in accordance with the present invention as implemented in a particular embodiment.

Figure 3:
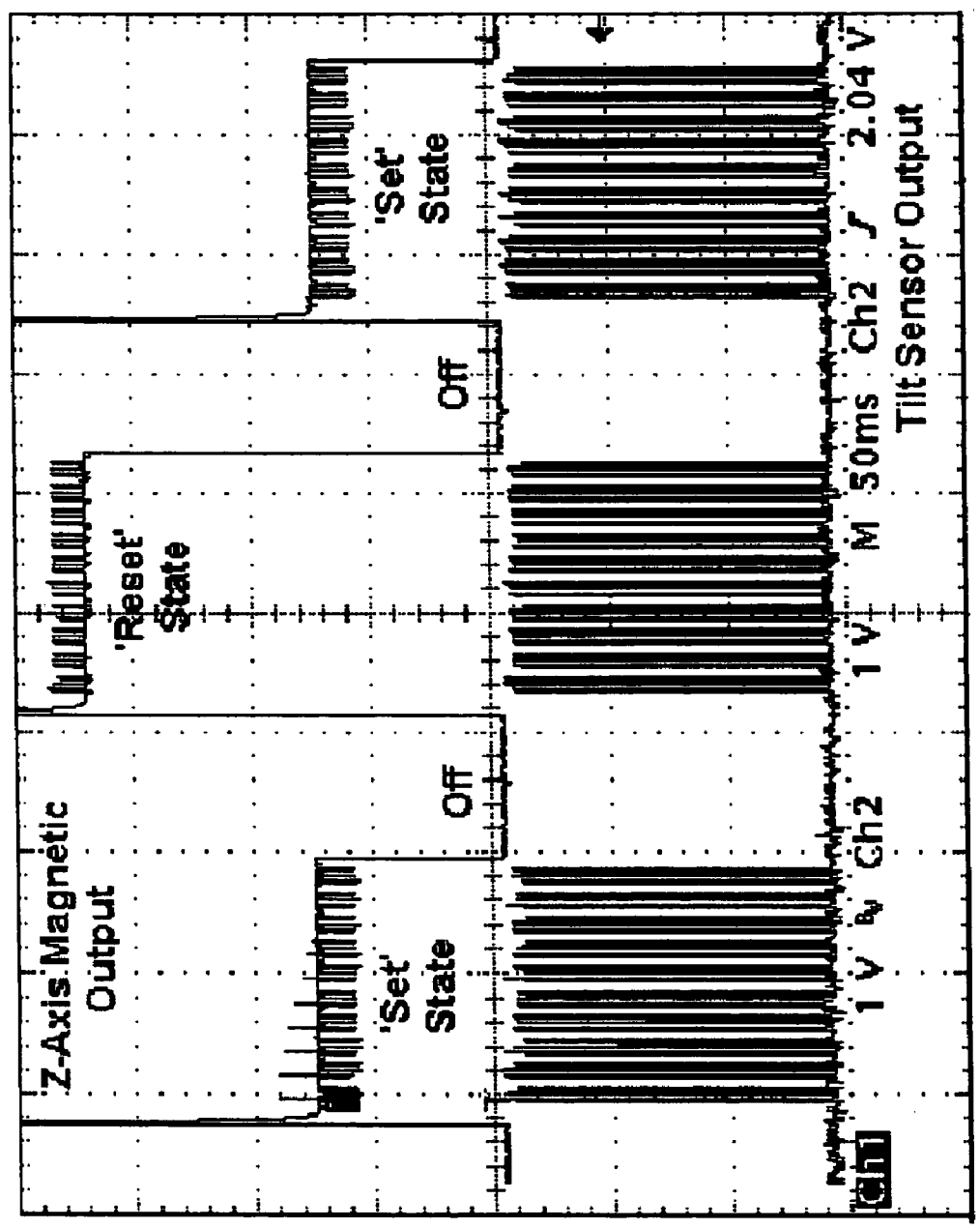
FIG. 3 illustrates a SET/RESET measurement cycle in accordance with the present invention as may be utilized, for example, in a specific implementation of a Mapstar™ II compass available from Laser Technology, Inc., assignee of the present invention.

With reference additionally now to FIG. 3, a SET/RESET measurement cycle as may be used in conjunction with an exemplary implementation of the techniques of the present invention is shown, as utilized in the Mapstar™ II compass available from Laser Technology, Inc, assignee of the present invention. In each 0.1-sec SET or RESET measurement block, the following analog/digital (A/D) measurements are made:

a) 40 X,Y, and Z magnetic output samples, (3×40)=120 A/D samples; 'N'=40);
b) 10 X,Y, and Z magnetic (+/−) gain measurements (3×2×10)=60 A/D samples; 'M'=10); and
b) 10 pitch/roll channel measurements (2×2×10=40 A/D measurements).

For economy of hardware, the X, Y, and Z MR chips share both a single SET/RESET and single OFFSET pulse generator. As a result of these shared generators;

i) The SET/RESET cycles for all sensors are synchronous; and
ii) The SET or RESET gain queries made for a given MR sensor show up simultaneously on the output of all the sensors. Hence it should be noted that the waveform timing for one MR channel is representative for all others.

It should be noted that the sampling intervals and relative ratio of output-to-gain samples utilized were not determined by the technique of the present invention itself, but were selected in light of the sampling rate required to reject 50/60 Hz magnetic interference and the speed of the particular microprocessor used in the hardware implementation of the Mapstar™ II compass.

Figure 4:
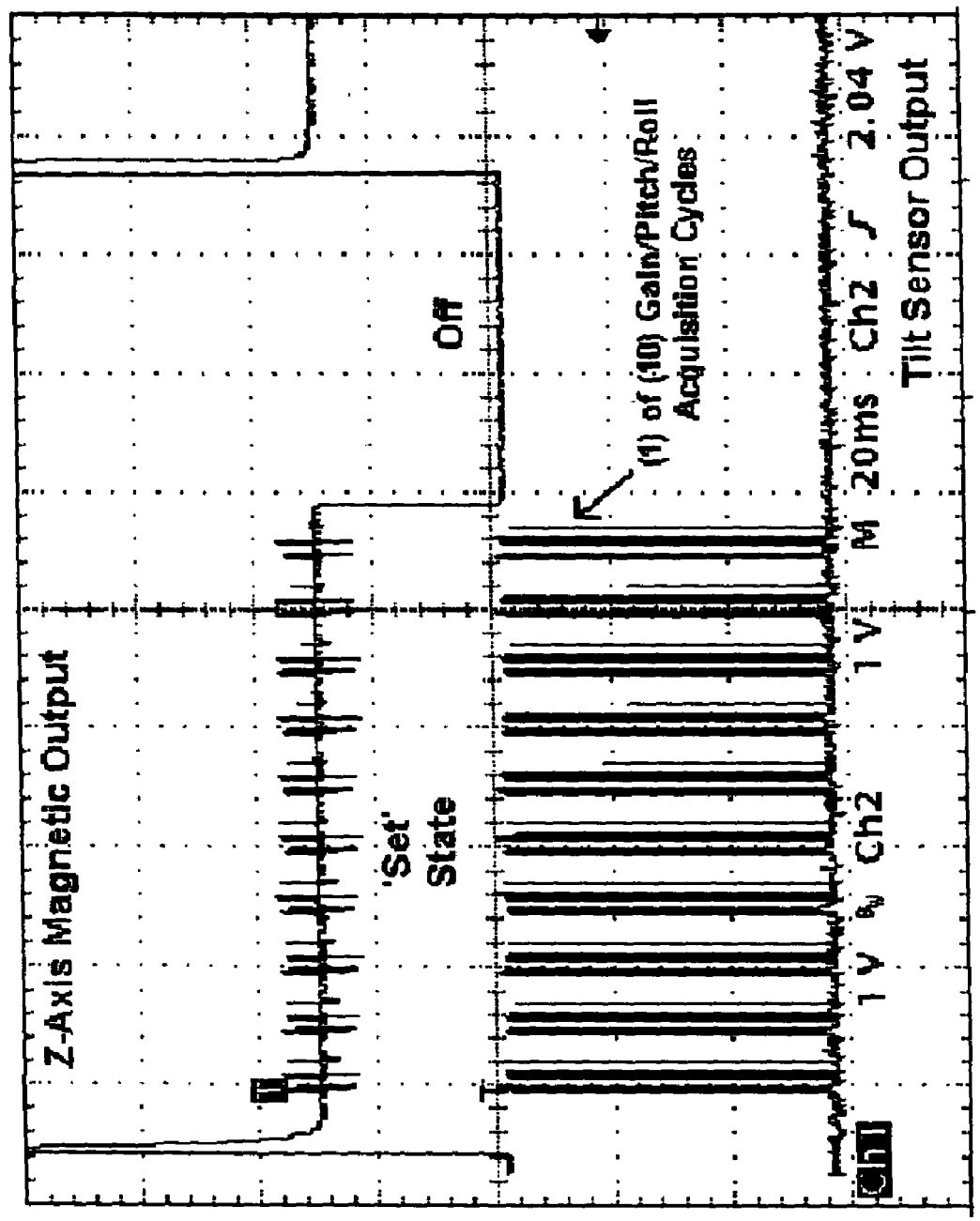
FIG. 4 is an expanded view of the SET portion of the measurement cycle illustrated in the preceding figure.
Figure 5:
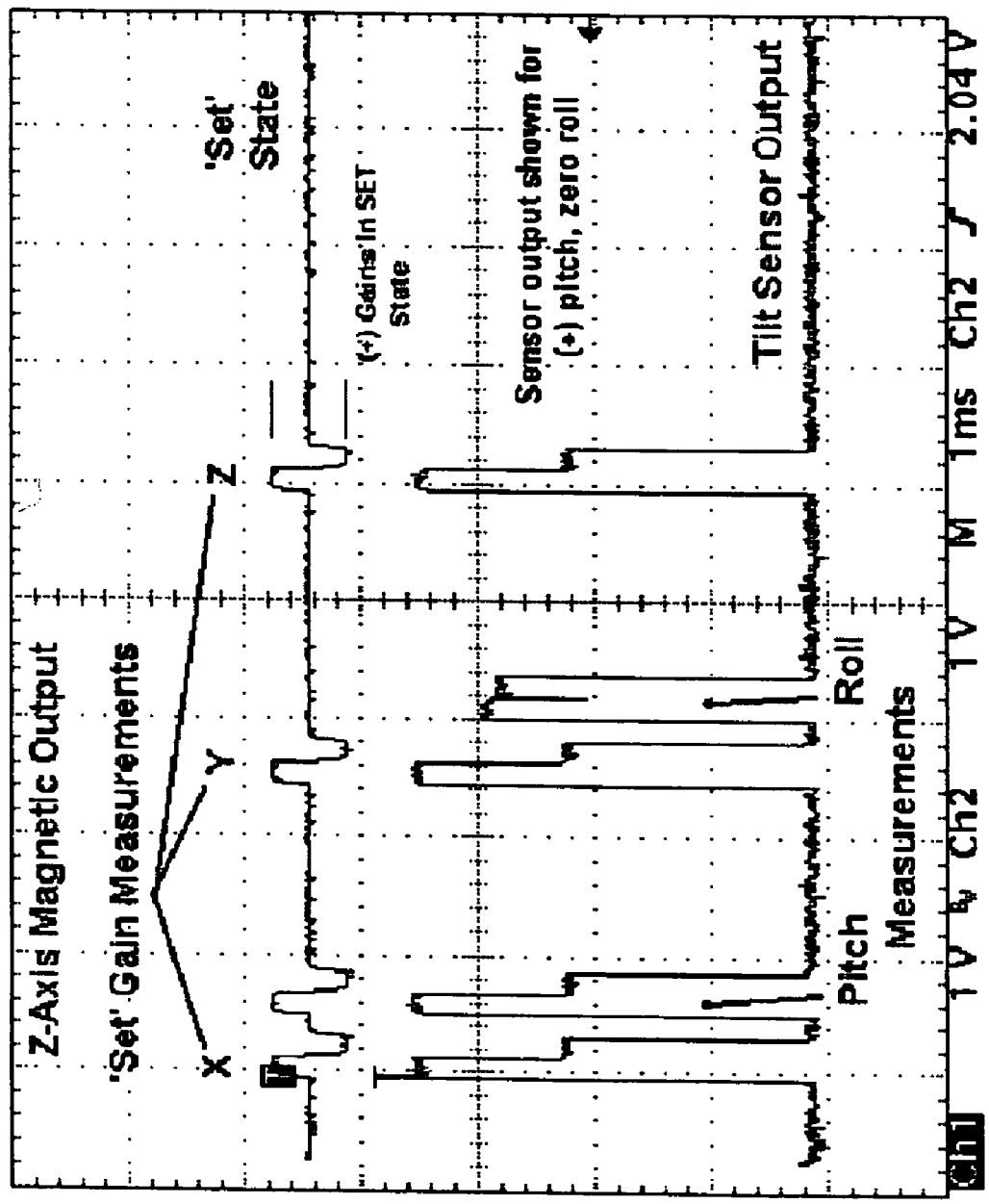
FIG. 5 illustrates one of the ten gain/pitch/roll acquisition sequences made in the SET magnetic state and indicates that the first sample of the X, Y or Z channel gain measurement is positive with respect to baseline while the second is negative.

With reference additionally now to FIGS. 4 and 5, an expanded view of the SET portion of the measurement cycle shown in the preceding figure is illustrated in the former figure while one of the ten Gain/Pitch/Roll acquisition sequences made in the SET magnetic state is shown in the latter. It should be noted that for the SET magnetic state, the first sample of a X, Y, or Z channel gain measurement is positive with respect to baseline (which represents the ambient magnetic field), while the second is negative. The positive difference between these two gain readings constitute a SET gain measurement.

Figure 6:
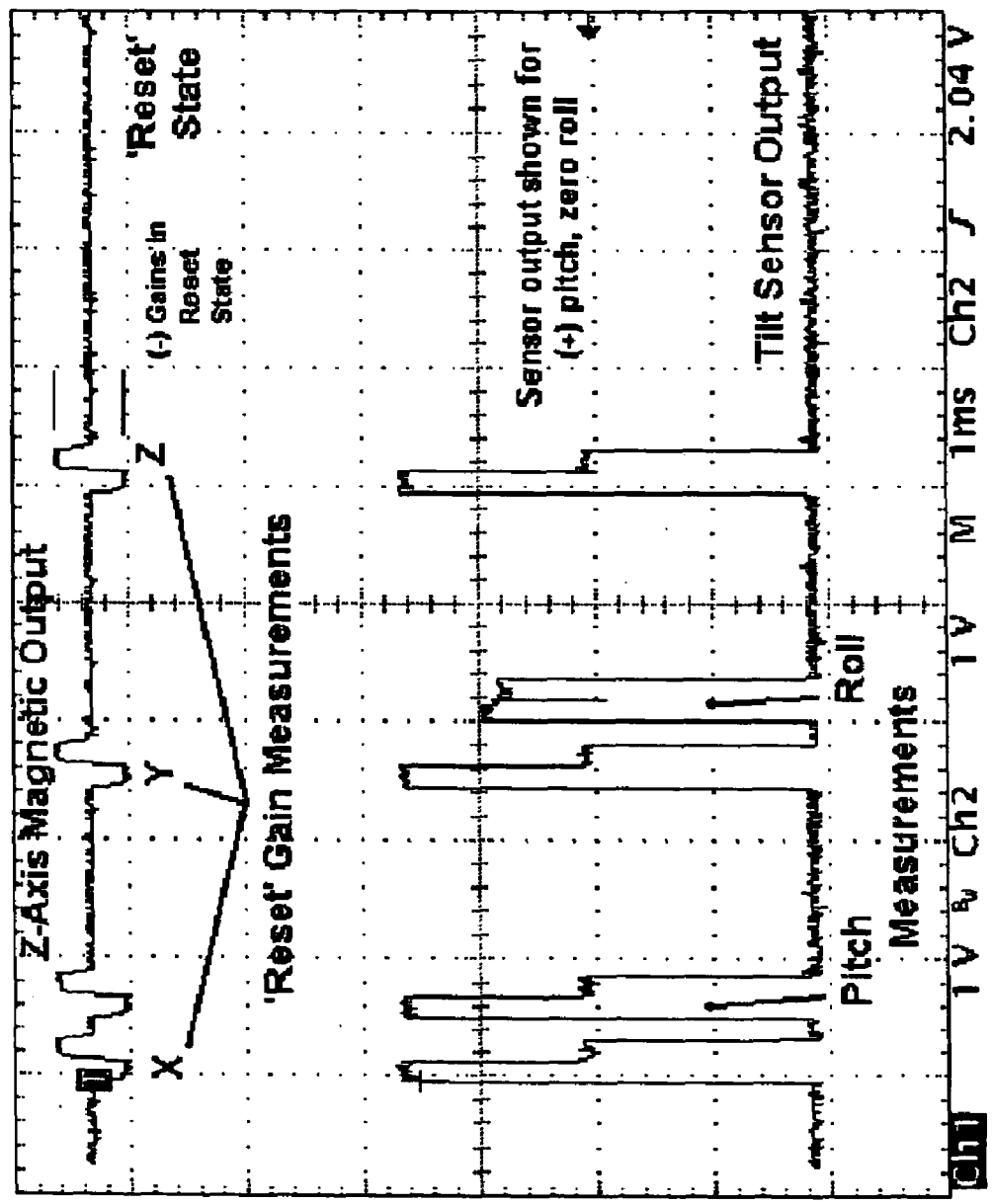
FIG. 6 illustrates one of the ten gain/pitch/roll acquisition sequences made in the RESET magnetic state and indicates that the first sample of the X, Y or Z channel gain measurement is instead negative with respect to baseline while the second is positive.

With reference additionally now to FIG. 6, the converse is true for the RESET gain measurement illustrated. The first sample of an X, Y, or Z channel gain measurement is negative with respect to baseline, while the second is positive, which results in a negative RESET gain measurement. The plus/minus gain polarity for the SET/RESET gains is due both to how the MR sensor 10 functions and the way the OFFSET strap 18 is energized during the measurements.

After block measurements for both the SET and RESET magnetic states are made, a normalized output, in which both temperature and magnetic cross-term effects are greatly reduced, can be calculated using the following formula:

$$Usen \cong \left(\frac{40}{10}\right) \frac{H}{(2 \cdot dH)} \cong \frac{\sum_1^{40} (\text{Set Outputs}) - \sum_1^{40} (\text{Reset Outputs})}{\sum_1^{10} (\text{Set Gains}) - \sum_1^{10} (\text{Reset Gains})}$$

The normalized output stream is updated as subsequent SET/RESET blocks become available.

With particular reference to pages 11, 12 and 15–19 of the Philips Publication (Appendix 1: The Magnetoresistive Effect) the "barber-pole" sensor equations can be developed. Equation (1) on page 15 defines the resistivity-field relationship as a function of the angle 'Θ' between the internal magnetization vector 'M' and current vector 'I', with '$\rho_\perp$' and '$\rho_\parallel$' being the resistivities respectively perpendicular and parallel to the magnetization vector 'M':

$$\rho[\Theta] = \rho_\perp + (\rho_\perp - \rho\|)\cos^2[\Theta]$$

From FIG. 17 on page 15, $\Theta$ can be expressed as the sum of (2) angles, $\Theta=\phi+\theta$, where '$\phi$' is the angle between vector M and the length-axis (+x axis), and '$\theta$' is the angle between vector I and the length-axis. Note that $\phi$ varies as vector M rotates under the influence of external fields, while vector I (hence $\theta$) is fixed for a given sensor type.

The quotient, '$Q=(\Delta\rho/\rho)=(\rho_\perp-\rho_\parallel)_{/\rho\perp}$', is defined as the anisotropic magnetoresistive constant, and equation (1) can be modified to show this constant:

$$\rho[\Theta]=\rho_\perp(1+Q\,Cos^2[\Theta])$$

For the simple geometry for the resistor shown in FIG. 17, the resistance-field equation is:

$$R[\Theta]=(LW/t)\rho[\Theta]=Ro(1+Q\,Cos^2[\Theta]),$$

where thickness 't' is much smaller than width 'W', which in turn is smaller than length 'L'. The quantity '$Ro=\rho_\perp(LW/t)$' is the equivalent resistance for a non-magnetoresistive, i.e., 'ordinary' resistor with similar geometry.

Following the discussions of pages 11, 12, and 17, the equations describing a 'barber-pole' MR bridge are derived here. First, the resistance equation is scaled by a scale factor '$\alpha$' to account for the resistance reduction due to the shorting strips:

$$R[\Theta]=(\alpha Ro)(1+Q\,Cos^2[\Theta])$$

The '$\alpha Ro$' term has the same physical interpretation as the original Ro, and equals the resistance value for an 'ordinary' resistor with shorting strips. Henceforth for brevity, the '$\alpha$' term will be dropped in subsequent equations.

It is now helpful to model the change in current direction caused by the addition of 'barber-pole' shorting strips. To do this, the rotation angle $\theta$ for current vector 'I' must be set to $\pm\pi/4$. Define 'Rn' to be a magnetoresistor whose value decreases with applied sensitive-axis field. For this case, $\theta=+\pi/4$:

$$Rn=Ro(1+Q\,Cos^2[+\pi/4+\phi])$$

'Rp' can be defined to be a magnetoresistor whose value increases with an applied sensitive-axis field. For this case, $\theta=-\pi/4$:

$$Rp=Ro(1+Q\,Cos^2[\pi/4+\phi])$$

Expanding the $Cos^2[\,]$ terms in both the 'Rn' and 'Rp' equations reveals the magnetic form-factor, '$Cos[\phi]\,Sin[\phi]$', which only depends on applied fields:

$$Rn=Ro(1+Q/2-Q\,Cos[\phi]Sin[\phi])=Ro(1+Q/2-Q\,FH[\phi])$$

$$Rp=Ro(1+Q/2+Q\,Cos[\phi]Sin[\phi])=Ro(1+Q/2+Q\,FH[\phi])$$

Re-distributing terms shows that that the 'barber-pole' resistors can be modeled by the sum and/or difference of two resistors:

$$Rn = (Ro)(1+Q/2) - (Ro)(Q)FH[\varphi]$$
$$= Ra[T] - Rb[T]FH[\varphi]$$
$$= Rt[T] - Rm[\varphi, T], \text{ and}$$
$$Rp = (Ro)(1+Q/2) + (Ro)(Q)FH[\varphi]$$
$$= Ra[T] + Rb[T]FH[\varphi]$$
$$= Rt[T] + Rm[\varphi, T], \text{ when}$$

'Rm' varies magnetically, and 'Rt' does not.

These resistance expressions then can be substituted into circuit topologies to derive equations reflecting various bridge-sensor/amplifier combinations. For a constant-voltage bridge, Vout is simply the difference between the (+) and (−) voltage-divider legs of the bridge. Expressing Vout in terms of Rm and Rt:

$$Vout = Vbr\cdot\frac{Rp-Rn}{Rp+Rn}$$
$$= Vbr\cdot\frac{(Rt+Rm-(Rt-Rm))}{(Rt+Rm+(Rt-Rm))}$$
$$= Vbr\cdot\frac{Rm[\varphi,T]}{Rt[T]}$$
$$= Vbr\cdot\left(\frac{Rb[T]}{Ra[T]}\right)\cdot FH[\varphi]$$

Vout for a constant-current bridge is relatively easy to derive by noting that sum (Rp+Rn) is a constant for any applied field, hence Vbr=I(Rp+Rn)/2:

$$Vout = Vbr\cdot\frac{Rp-Rn}{Rp+Rn}$$
$$= \left(I\cdot\frac{(Rp+Rn)}{2}\right)\cdot\frac{(2\cdot Rm)}{(Rp+Rn)}$$
$$= I\cdot Rm[\varphi,T]$$
$$= I\cdot Rb[T]\cdot FH[\varphi]$$

Note that the mathematical form for Vout in both MR bridge expressions is a product of (2) functions, one being of temperature, and the other being simply the magnetic form-factor of the 'barber-pole' magnetoresistors. The temperature function derives from the temperature dependencies of Ro and/or Q:

$$Vout=(Vbr(2Q/(2+Q)))FH[\phi] \text{ for the 'V' bridge}$$

$$Vout=(I\,Ro\,Q)FH[\phi] \text{ for the 'I' bridge}$$

The $V_{OUT}$ expressions for both the constant-voltage and constant-current bridges can be generalized again into the form:

$$V_{OUT}=CO+C1[T]FH[\phi[Hx,Hy]],$$

where 'CO' is considered a constant, C1 [T] is some function of temperature, and FH[$\phi$[Hx,Hy]] is a reasonable approximation for the 'barber-pole' MR resistor magnetic form-factor. For the cases of the constant-voltage and constant-current bridges, 'CO' represents the zero-field bridge offset voltage, which is caused by resistance mismatches occurring during fabrication.

Other circuit topologies whose output can approximate the 'CO+C1 FH' form can be used with the techniques of the present invention. The Mapstar™ II compass uses a constant-voltage MR bridge coupled with an single operational-amplifier approximation for a true differential bridge amplifier; the Rt/Rm form for the Vout equation looks like:

$$Vout = \frac{Vbr}{2} + Vbr\cdot\left[\frac{1}{2} + \frac{2\cdot Rf}{Rt+2\cdot Rg - Rm^2/Rt}\right]\cdot\frac{Rm}{Rt}$$

Zeroing the tiny '$Rm^2/Rt$' term (because Rt>>Rm, hence Rt>>$Rm^2$/Rt as well) results in an approximation with the desired 'C0+C1 FH' form:

$$Vout \cong \frac{Vbr}{2} + Vbr \cdot \left[\frac{1}{2} + \frac{2 \cdot Rf}{Rt + 2 \cdot Rg}\right] \cdot \left(\frac{Rb[T]}{Ra[T]}\right) \cdot FH[\varphi]$$

$$\approx C0 + C1[T] \cdot FH[\varphi]$$

In order to complete the MR resistor/bridge equations, the magnetic form-factor needs to be expressed in terms of both the sensitive ('Hx') and cross-axis ('Hy') fields instead of '$\varphi$':

$$FH[\varphi[Hx,Hy]] = NewFH[Hx,Hy]$$

This equation defines $\varphi[Hx,Hy]$ in terms of a transcendental equation:

$$\sin[\varphi] = Hy/(Ho+(Hx/\cos[\varphi]))$$

Because of the transcendental nature of $\varphi[Hx,Hy]$, only approximations for FH[Hx,Hy], and ultimately, any type of 'barber-pole' MR sensor, can be defined. This equation, however, can be solved numerically, which allows for the comparison of various form-factor approximations as well as numerical simulations of magnetoresistive sensor/amplifier topologies.

The simplest approximation for FH[Hx,Hy], and the one used for the 'Vout' expression given in the AN-205 application note reference, assumes that '$\varphi$' is small enough such that that Cos [$\varphi$]≅1, in both 'FH[$\varphi$]' and equation (6) therein states:

$$FH[\varphi] = \cos[\varphi] \sin[\varphi] \cong (1) \sin[\varphi], \text{ and}$$

$$\sin[\varphi] \cong Hx/(Ho+Hy/(1)),$$

which leads to $$FH[Hx,Hy] \cong Hx/(Hy+Ho), \text{ or}$$

$$FH[H,Hca] \cong H/(Hca+Hs) \text{ (as denominated in AN-205)}$$

'Vout' for the constant-voltage bridge becomes:

$$Vout = (Vbr(2Q/(2+Q)))FH[\varphi]$$

$$\cong a(H/(Hca+Hs)),$$

which assumes $$a \cong (Vbr\ Q),$$

which is a good approximation if since Q<<2
'Vout' for the constant-current bridge is:

$$Vout = (IRoQ)FH[\varphi]$$

$$\cong a(H/(Hca+Hs)), \text{ where } a \cong (IRoQ)$$

Note that these equations derived for the constant voltage and current MR bridge types matches the 'Vout' equation given the AN-205 application note reference.

Although the AN-205 'Vout' approximation is suitable for most applications, experimental evidence to be shown hereinafter indicates refinements are needed to model the finer features a MR bridge sensor. Specifically, actual SET-RESET gain differences show quadratic-like variations for BOTH the sensitive and cross-axis fields, but the AN-205 approximation predicts NO variation with the sensitive-axis field:

$$Vgain\_diff = C1[T]*((4\ Ho\ dH)/(Ho^2-Hy^2))$$

has no 'Hx', the sensitive-axis field term

To derive a second approximation for FH[$\varphi$[Hx,Hy]], assume that that Cos [$\varphi$]≅1 only for equation (6), but not for FH[$\varphi$]. Given that $$\sin[\varphi[Hx,Hy]] \cong Hx/(Ho+Hy),$$

$$\cos[\varphi] = Sqrt[1-\sin^2[\varphi]], \text{ and}$$

$$FH[\varphi] = \sin[\varphi] \cos[\varphi],$$

the second 'FH' approximation equals:

$$FH[Hx, Hy, Ho] \cong \left(\frac{Hx}{Hy+Ho}\right) \cdot Sqrt\left[1 - \left(\frac{Hx}{Hy+Ho}\right)^2\right]$$

Comparing both the AN-205 and second form-factor approximations via a reference numerical solution indicates the second approximation reduces the maximum approximation error (0.30% versus 0.026%) by about one order of magnitude for a sensitive/cross-axis field range of ±0.6 Gauss with Ho=8 Gauss.

To verify this second approximation, the SET gain–RESET gain (a composite of several functions) using this form-factor was determined:

$$Vgain\_diff = C1[T]Gdiff[Hx,Hy,Ho,dH],$$

where function $$Gdiff[Hx,Hy,Ho,dH] = Gset[Hx,Hy,Ho,dH] - Grset[Hx,Hy,Ho,dH], \text{ and}$$

$$Gset[Hx,Hy,Ho,dH] = FH[Hx+dH,Hy,+Ho] - FH[Hx-dH,Hy,+Ho]$$

$$Grset[Hx,Hy,Ho,dH] = FH[Hx+dH,Hy,-Ho] - FH[Hx-dH,Hy,-Ho]$$

For comparison purposes, 'Vgain_diff' needs to be normalized with respect to amplifier and A/D scale factors; this is done by dividing 'Vgain_diff' with its zero-field value:

$$\text{Normalized } Vgain\_diff = Gdiff[H,Hca,Ho,dH]/Gdiff[0,0,Ho,dH]$$

As this normalized 'Vgain_diff' expression is fairly involved, it will not be reproduced herein. A second-order series expansion, however, is useful in illustrating on how the normalized SET-RESET gain behaves while Hx and Hy vary individually:

i) For Hy=0 and dH→0, the series expansion indicates that the normalized SET-RESET gain decreases quadratically with the sensitive-axis field, 'Hx':

$$\text{Normalized } Vgain\_diff \cong 1 + ((-2/3)Ho^2)^{-1} Hx^2$$

ii) For Hx=0 and dH->0, the series expansion indicates that the normalized SET-RESET gain increases quadratically with the cross-axis field, 'Hy':

$$\text{Normalized } Vgain\_diff \cong 1 + (Ho^2)^{-1} Hy^2$$

As both these behaviors are consistent with both experimental data and numerical simulation, it is concluded the second approximation is adequate for further symbolic work.

To determine the amount of cross-term reduction afforded by the techniques of the present invention, both 'calibrated' SET-RESET magnetic outputs and sensitive-axis outputs are required. The SET-RESET magnetic output equals:

$$\text{Vmag\_diff} \equiv \text{Vmag\_set} - \text{Vmag\_rset}$$
$$= C1[T]Mdiff[H, Hca, Ho, dH],$$

where function $$Mdiff[H,Hca,Ho,dH]=FH[H,Hca,+Ho]-FH[H,Hca,-Ho]$$

The scaled sensitive-axis output is defined as:

$$\text{Scaled Sensitive Axis Output} = Hsen = (2*dH) \cdot \frac{Mdiff[H, \ldots, dH]}{Gdiff[H, \ldots, dH]} \approx H$$

By analogy, both the 'Vmag_diff' and 'Hsen' output functions can be visualized as having a "spine" running along the sensitive-axis, out of which quadratic "ribs" emanate in the cross-axis direction:

$$Vmag\_diff[H,Hca] \cong SpineMdif[H] + RibMdif[H]Hca^2,$$
and $$Hsen[H,Hca] \cong SpineHsen[H] + RibHsen[H]Hca^2$$

The 'Spine[]' functions (ideally equal to 'H') describe the shape of the sensitive-axis spine, and the 'Rib[]' functions (ideally zero) describe how far the ribs extend above or below the spine.

To calibrate the SET-RESET magnetic output, a calibration by "excursion" is done by comparing values for 'Vmag_diff' at two equal-but-opposite sensitive-axis field excursions, with the cross-axis field equaling zero: The calibration constant-of-proportionality equals:

$$KMDIFF \equiv (2\ Hcal)/(SpineMdif[+Hcal] - SpineMdif[-Hcal])$$

The calibrated SET-RESET magnetic output equals:

$$\text{Calibrated 'Vmag\_dif'} = KMDIFF \times \text{Vmag\_diff}$$
$$= KMDIFF(SpineMdif[H] + RibMdif[H]Hca^2)$$

A calibration by 'excursion' in also done for 'Hsen' to account for its small non-linearities at the maximum field excursion points; the calibration constant, 'KMSENS', is close to unity:

$$KMSENS \equiv (2\ Hcal)/(SpineHsn[+Hcal] - SpineHsn[-Hcal])$$

The calibrated sensitive-axis output equals:

$$\text{Calibrated 'Hsen'} = KMSENS \times \text{'Hsen'}$$
$$= KMSENS(SpineHsen[H] + RibHsen[H]Hca^2)$$

The desired cross-term reduction equation is found by taking the quotient of the calibrated "rib" functions. Using the symbolic forms provided by the second magnetic form-factor approximation, the mathematical form for the cross-term reduction looks like:

$$Xterm - \text{Reduction }[H] \cong \frac{KMDIFF}{KHSENS} \cdot \left( \frac{RibMdif[H] \cdot Hca^2}{RibHsen[H] \cdot Hca^2} \right)$$
$$\cong -c0 + \frac{c1}{(dH^2 + c2 \cdot H^2)}$$

From this equation form, it can be inferred that;
i) As 'H' goes to zero, the cross-term reduction is limited by 'dH'. Hence for small fields, the smaller the 'dH', the greater the cross-term reduction.
ii) For larger 'H', the reduction decreases as the inverse square of 'H', or in an roughly logarithmically manner, regardless of the value of 'dH'.

Concerning sensitive-axis linearization, some insight can be gained by examining an series approximation for the 'spine' of 'Hsen':

$$SpineHsen[H] \cong H + (Ho^{-2})H^3$$

An inversion of this simple cubic series can be found by changing the 'H³' term to 'Hsen³' then solving for 'H'; this creates a linearizing function for 'Hsen':

$$H_{Calibrated} \cong Hsen - (Ho^{-2}) \cdot Hsen^3$$

More elaborate linearization schemes can be constructed both by numerical and symbolic techniques.

With reference additionally now to FIGS. 9A and 9B, an experimental validation of the SET-RESET gain normalization equations derived in accordance with the technique of the present invention is shown. In this experiment (performed at room-temperature, T≅25° C.) a Honeywell HMC1002 MR dual-axis sensor (1 MR bridge/axis) was rotated through 360 degrees (at level) in the Earth's magnetic field while recording the SET-RESET magnetic channel output along with both the SET and RESET gains for each axis. From this data, one would hypothesize that after calculating both the sensitive and cross-axis outputs for each axis, one could determine for each MR chip:
1) The cross (insensitive) axis direction;
2) The sensor constant, 'Ho';
3) The OFFSET strap field, 'dH';
4) The sensor OFFSET strap current-to-field conversion constant, denominated 'OFFSET Field' by the Honeywell Datasheet, given that the OFFSET strap current, 'Iofst', equals 6 milliamperes;

It is generally known that the horizontal magnetic field for the experiment location (i.e. Denver, Colo.) is substantially 0.2 Gauss.

The AN-205 application note indicates a nominal value for 'Ho' of 8.0 Oersted, which is equivalent to 8.0 Gauss in free-air.

The constant 'dH' is related both the OFFSET strap current and the OFFSET current-to-field conversion constant, which is nominally specified by the Honeywell Datasheet at 51 milliamperes/Gauss. The formula needed to calculate this conversion constant is:

$$\text{OFFSET Field} = Iofst/dH$$

It should be noted that in this particular experiment, forty SET-RESET magnetic measurements ('N'=40) and ten SET and RESET gain measurements ('M'=10) were taken per 0.1 second block, but this rate was determined solely by the interrupt overhead of the microprocessor in use in the particular embodiment under test (e.g. a Mapstar™ II compass)

Assuming that the XY MR chips are orthogonal to each other, the sensitive-axis output of each chip should be proportional the cross-axis output of the other as they are both rotated in the Earth's magnetic field. Therefore plotting the cross-axis output of each sensor against the sensitive-axis output of its sister-chip should reveal whether the cross-axis direction is parallel (+slope) or anti-parallel (−slope) to the sister chip's sensitive-axis.

The sensitive-axis output for each sensor is found using the following formula, which takes into account the unequal number (required to find a correct 'dH') of output versus gain samples per sampling period:

$$Usen \cong \frac{H}{(2 \cdot dH)} = \frac{10}{40} \cdot \frac{\sum_{1}^{40}(\text{Set Outputs}) - \sum_{1}^{40}(\text{Reset Outputs})}{\sum_{1}^{10}(\text{Set Gains}) - \sum_{1}^{10}(\text{Reset Gains})}$$

The cross-axis output for each sensor is negated in order to give a positive constant-of-proportionality, which will prove less confusing when determining cross-axis direction and finding 'Ho':

$$Ucross \cong \frac{Hca}{(+Ho)} = -\frac{Hca}{(-Ho)}$$

$$= -\frac{\sum(\text{Set Gains}) + \sum(\text{Reset Gains})}{\sum(\text{Set Gains}) - \sum(\text{Reset Gains})}$$

Figure 11A:
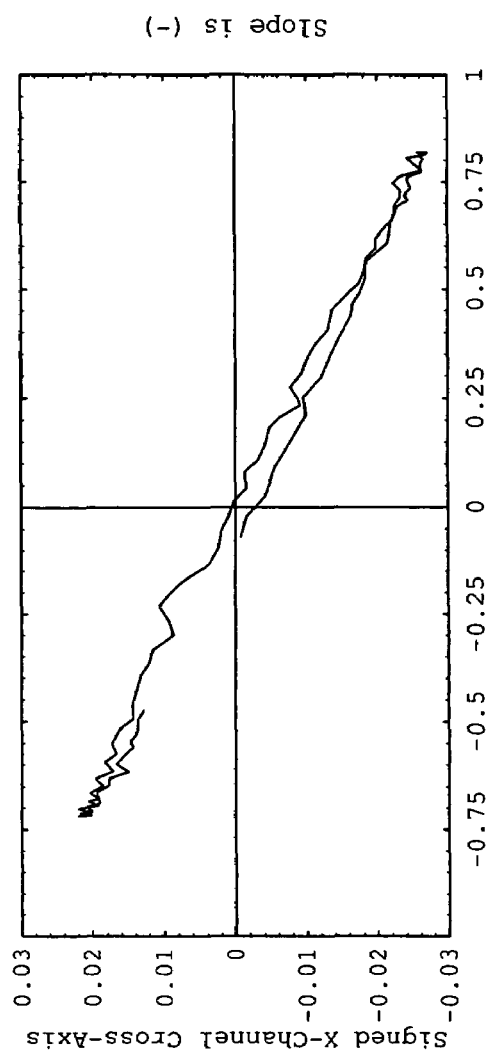
FIGS. 11A and 11B are plots of the X and Y-channel signed cross-axis outputs with respect to the sensitive-axis outputs of their sister channels and wherein the negative slope of FIG. 11A indicates the 'X' cross-axis points in the '−Y' direction and the positive slope of FIG. 11B indicates that the 'Y' cross-axis points in the '+X' direction.

With particular reference to FIG. 11A, the negative-slope of the X-channel cross-axis versus Y-channel sensitive-axis plot indicates that the X-channel cross-axis points in the (−Y) axis direction.

Figure 11B:
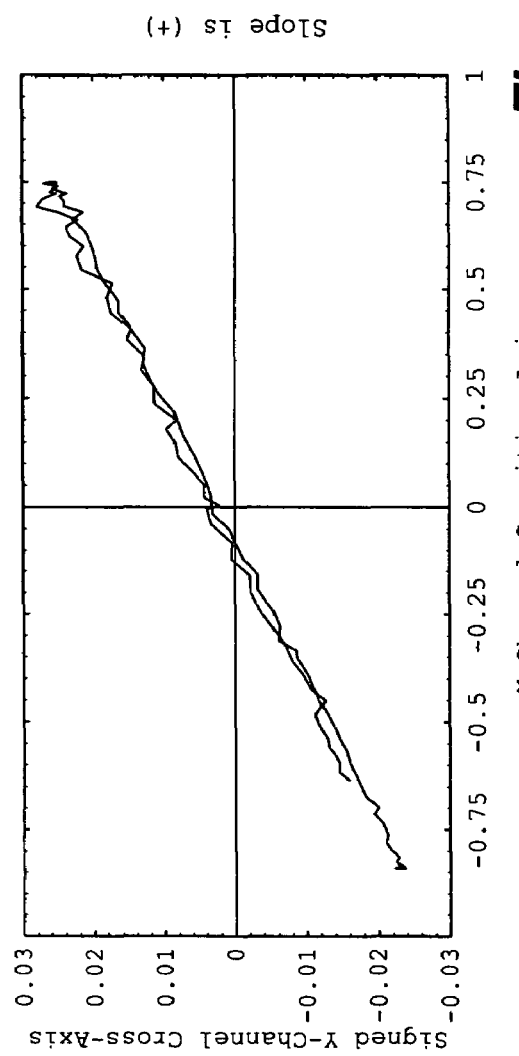

Conversely, with particular reference to FIG. 11B, the positive-slope of the Y-channel cross-axis versus X-channel sensitive-axis output plot indicates that the Y-channel cross-axis points in the (+X) axis direction.

Knowing that for the Mapstar™ II compass:
  i) The (+Y) chip sensitive-axis points to the LEFT of the forward-looking (+X) chip; and
  ii) The (+X) chip sensitive-axis points to the RIGHT of the forward-looking (+Y) chip;
The cross-axis direction for both chips is to the RIGHT of a forward-looking sensitive-axis. This was expected, as similar sister chips must have identical cross-axis directions.

Again with particular reference to FIGS. 11A and 11B, knowledge that each plot projection onto either a sensitive or cross-axis is associated with a 0.4 Gauss change (due to the rotation) allows for the calculation of both 'dH' and 'Ho':

'dH_X' = (0.4 Gauss/X Sensitive-axis Excursion)/2

= (0.4 Gauss/1.591) ≅ 0.126 Gauss

'Ho_X' ≅ (0.4 Gauss/X Cross-axis Excursion)

-continued
= (0.4 Gauss/0.04902) ≅ 8.16 Gauss

'dH_Y' ≅ (0.4 Gauss/Y Sensitive-axis Excursion)/2

= (0.4 Gauss/1.583) ≅ 0.130 Gauss

'Ho_Y' ≅ (0.4 Gauss/Y Cross-axis Excursion)

= (0.4 Gauss/0.05166) ≅ 7.74 Gauss

The calculated 'OFFSET Field' values are:

'OFFSET Field_X' = Iofst/dH_X

= (6 mA/0.126 Gauss) ≅ 47.6 mA/Gauss

'OFFSET Field_Y' = Iofst/dH_X

= (6 mA/0.130 Gauss) ≅ 46.2 mA/Gauss

All the values calculated for 'Ho' and 'OFFSET Field' are consistent with the AN-205 reference and Honeywell Datasheet.

Figure 12A:
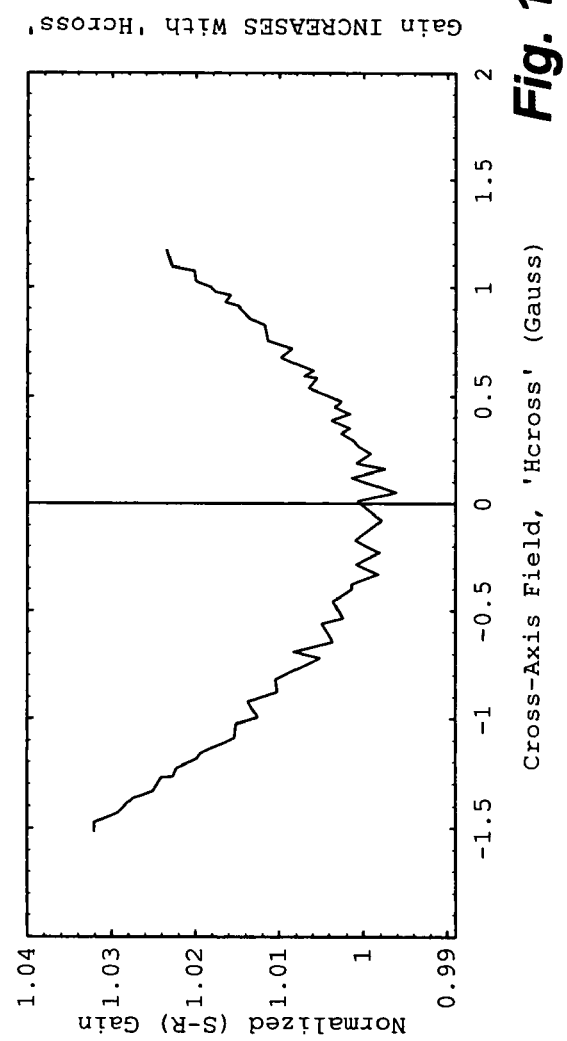
Figure 12B:
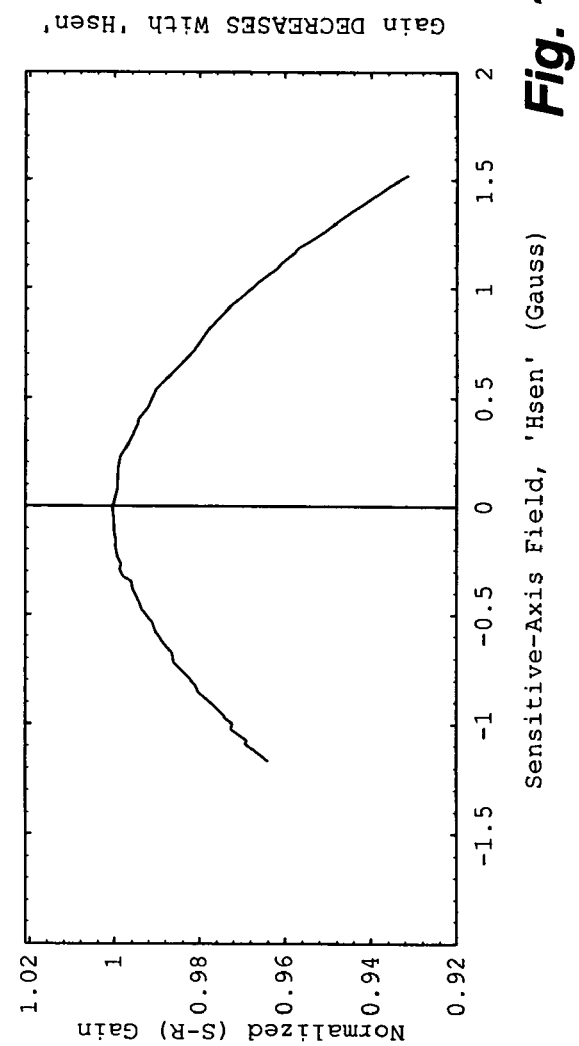

With reference additionally now to FIGS. 12A and 12B, a further experimental validation of the SET-RESET gain normalization equations derived in accordance with the technique of the present invention is shown wherein the fine features of the magnetic form factor are checked. The experimental set up comprised:

1) Placing the HMC1002 MR dual-axis sensor in a small Helmholtz coil, with the Y-axis MR bridge (chip) aligned with the coil axis;

2) Aligning the Helmholtz coil axis roughly to magnetic North;

3) Energizing the coil, and adjusting the MR sensor board position to maximize the Y-axis signal; and 4) De-energizing the coil, and then adjusting the Helmholtz coil direction to minimize the X-axis signal.

With this alignment, most of the signal developed by the Y-axis chip will be due to its sensitive axis. Conversely, most of the signal developed by the X-axis chip will be due to its cross-axis field, which is reported by the negated sensitive-axis output of the Y-chip.

5) After completing the sensor board alignment, the Helmholtz coil current was slowly swept to generate an Y-axis field of approximately −1.2 to +1.5 Gauss. During the sweep, the SET-RESET magnetic channel output along with both the SET and RESET gains for each axis were recorded at room-temperature, T≈25° C.

As before, forty SET-RESET magnetic measurements ('N'=40) and ten SET and RESET gain measurements ('M'=10) were taken per 0.1 second block, but this rate was determined solely by the interrupt overhead of the microprocessor in use in the particular embodiment under test (e.g. a Mapstar™ II compass).

The Y-channel scaled sensitive-axis output was determined using the following formula, assuming a default value of (6 mA×(1 Gauss/51 mA))=0.12 Gauss for 'dH':

Hsen_Y ≈ H $$= \frac{10}{40} \cdot (2 \cdot dH) \cdot \frac{\sum_{1}^{40}(\text{set Outputs}) - \sum_{1}^{40}(\text{Reset Outputs})}{\sum_{1}^{10}(\text{set Gains}) - \sum_{1}^{10}(\text{Reset Gains})}$$

With reference additionally now to FIG. 12A, a quadratic least squares (LSQ) fit was done to determine the X-axis SET-RESET gain variation with the negative of the scaled Y-axis sensitive output, which reports the X-chip cross-axis field. After normalization by the LSQ 'constant' coefficient, the normalized SET-RESET gain was plotted against the reported cross-axis field. This plot is illustrative of the fact that SET-RESET gain increases with cross-axis field. Computationally, the LSQ fit shows:

$$\text{Normalized } S\text{-}R \text{ Gain} \cong (5120.6 + 78.01 \ Hca^2)/5120.6$$

$$\cong (1 + 65.643^{-1} \ Hca^2)$$

The measured versus calculated values for the inverse of the normalized quadratic term are:

$$65.643 \text{ versus } (Ho^2)^{-1} = (8^2)^{-1} = 64$$

With reference additionally now to FIG. 12B, a second quadratic least squares (LSQ) fit was done to determine the Y-axis SET-RESET gain variation with the scaled Y-axis sensitive output. The normalized SET-RESET gain was then plotted against the reported sensitive-axis field. The resultant plot was also illustrative of the fact that SET-RESET gain decreases with sensitive-axis field. Mathematically:

$$\text{Normalized S-R Gain} \cong (5406.5 + 161.25 \ Hca^2)/5406.5$$

$$\cong (1 - 33.53^{-1} \ Hca^2)$$

The measured versus calculated values for the inverse of the normalized quadratic term are:

$$-33.53 \text{ versus } (-\tfrac{2}{3})(Ho^2)^{-1} = (0.667)(8^2)^{-1} = -42.67$$

What has been provided, therefore, is a measurement technique for normalizing the sensitive-axis output of a magnetoresistive (MR) sensor which greatly reduces both temperature effects and magnetic contributions from the insensitive-axis cross-terms. As described herein, the normalization techniques disclosed may be effectuated by direct measurement with no prior knowledge of the sensor constants being required and may be performed for a single sensor with multiple sensors also not being required in order to estimate the cross-axis fields for each of the other sensors. The techniques disclosed provide an output proportional to the insensitive-axis field as well as that of the sensitive-axis and, when combined with knowledge of ambient field strengths, can be used to determine fundamental MR sensor constants which then allows for correction of higher-order sensor non-linearities. The techniques disclosed are particularly conducive to low power supply availability applications such as, for example, those encountered battery powered equipment.

While there have been described above the principles of the present invention in conjunction with specific circuit implementations and sensor technologies, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for normalizing an output of the sensitive axis of a magnetic sensor having SET/RESET field generating elements, said output being substantially determined by a method comprising:
    sampling a number of SET outputs of said sensor to produce a first sum;
    sampling a number of RESET outputs of said sensor to produce a second sum;
    sampling a number of SET gains of said sensor to produce a third sum;
    sampling a number of RESET gains of said sensor to produce a fourth sum;
    subtracting said second sum from said first sum to produce a first result;
    subtracting said fourth sum from said third sum to produce a second result; and
    dividing said first result by said second result.

2. The method of claim 1 wherein said output is also substantially determined by dividing the magnetic field (H) by the quantity (2*dH).

3. The method of claim 1 wherein said number of SET outputs, RESET outputs, SET gains and RESET gains is at least one.

4. A method for determining the cross-axis output of the insensitive axis of a magnetic sensor having SET/RESET field generating elements, said cross-axis output being substantially determined by:
    sampling a number of SET gains of said sensor to produce a first sum;
    sampling a number of RESET gains of said sensor to produce a second sum;
    adding said first sum to said second sum to produce a first result;
    subtracting said second sum from said first sum to produce a second result; and
    dividing said first result by said second result.

5. A method for normalizing an output of the sensitive axis of a magnetic sensor having SET/RESET and OFFSET field generating elements, said output being substantially determined by a method-comprising:
    furnishing a pulse having a first direction to said SET/RESET field generating element to establish a SET magnetic state;

sampling an output of said magnetic sensor to establish a SET magnetic output;
providing a pulse having said first direction to said OFFSET field generating element;
sampling said output of said magnetic sensor to establish a first sample;
providing another pulse having a second direction opposite to said first direction to said OFFSET field generating element;
further sampling said output of said magnetic sensor to establish a second sample; and
subtracting said second sample from said first sample to establish a SET gain.

6. The method of claim 5 wherein said act of furnishing a pulse having a first direction to said SET/RESET field generating element is carried out by applying a positive-going current pulse.

7. The method of claim 5 wherein said act of providing a pulse having a first direction to said OFFSET field generating element is carried out by applying a positive-going current pulse.

8. The method of claim 5 wherein said act of providing another pulse having a second direction opposite to said first direction to said OFFSET field generating element is carried out by applying a negative-going current pulse.

9. The method of claim 5 wherein said acts of sampling said output of said magnetic sensor are carried out by means of an A/D converter.

10. The method of claim 5 wherein said acts of sampling an output of said magnetic sensor to establish said SET magnetic output through subtracting said second sample from said first sample to establish said SET gain are repeated at least one additional time.

11. The method of claim 5 further comprising:
providing a pulse having a second direction opposite to said first direction to said SET/RESET field generating element to establish a RESET magnetic state.

12. The method of claim 11 wherein said acts of providing said pulses having a first and second direction to said SET/RESET field generating element to establish respective SET and RESET magnetic state are carried alternately.

13. A circuit comprising:
a magnetic sensor having first and second terminals thereof;
SET/RESET field generating elements disposed at a first location with respect to said magnetic sensor;
OFFSET field generating elements disposed at a second location with respect to said magnetic sensor so as to generate a field orthogonal to that generated by said SET/RESET field generating elements;
an amplifier coupled to said first and second terminals of said magnetic sensor and having an output thereof;
an A/D converter coupled to said output of said amplifier for producing a control signal;
a SET/RESET pulse generator coupled to said SET/RESET field generating elements;
an OFFSET generator coupled to said OFFSET field generating elements; and
a control block adapted to receive said control signal from said A/D converter and providing control output signals to said SET/RESET pulse generator and said OFFSET generator.

14. The circuit of claim 13 wherein said magnetic sensor comprises a magnetoresistive sensor.

15. The circuit of claim 14 wherein said magnetic sensor comprises a barber-pole magnetoresistive sensor.

16. The circuit of claim 13 wherein said SET/RESET field generating elements comprise opposing SET/RESET straps.

17. The circuit of claim 16 wherein said SET/RESET straps are orthogonal to an easy axis of said magnetic sensor.

18. The circuit of claim 13 wherein said SET/RESET field generating elements comprise opposing SET/RESET coils.

19. The circuit of claim 18 wherein said SET/RESET coils are orthogonal to an easy axis of said magnetic sensor.

20. The circuit of claim 13 wherein said OFFSET field generating elements comprise opposing OFFSET straps.

21. The circuit of claim 20 wherein said OFFSET straps are orthogonal to a sensitive axis of said magnetic sensor.

22. The circuit of claim 13 wherein said OFFSET field generating elements comprise opposing OFFSET coils.

23. The circuit of claim 22 wherein said OFFSET coils are orthogonal to a sensitive axis of said magnetic sensor.

24. The circuit of claim 13 wherein said SET/RESET generator is operative to supply pulses to said SET/RESET field generating elements to establish SET and RESET magnetic states.

25. The circuit of claim 24 wherein said pulses are current pulses.

26. The circuit of claim 24 wherein said pulses are voltage pulses.

27. The circuit of claim 24 wherein said pulses are of a first direction to establish said SET state and a second opposite direction to establish said RESET state.

28. The circuit of claim 13 wherein said OFFSET field generator is operative to supply pulses of alternating first and second directions to said OFFSET field generating elements.

29. The circuit of claim 28 wherein said pulses are current pulses.

30. The circuit of claim 28 wherein said pulses are voltage pulses.

31. The circuit of claim 13 wherein said control block comprises a microprocessor.

* * * * *